United States Patent
Makarov et al.

(10) Patent No.: US 10,275,547 B2
(45) Date of Patent: Apr. 30, 2019

(54) METHOD AND SYSTEM FOR ASSESSING PERFORMANCE OF ARBITRARILY LARGE ARRAYS

(71) Applicant: The Mathworks, Inc., Natick, MA (US)

(72) Inventors: Sergey Makarov, Holden, MA (US); Vishwanath Iyer, Ashland, MA (US); Shashank Kulkarni, Ashland, MA (US)

(73) Assignee: The MathWorks, Inc., Natick, MA (US)

( * ) Notice: Subject to any disclaimer, the term of this patent is extended or adjusted under 35 U.S.C. 154(b) by 679 days.

(21) Appl. No.: 14/730,148

(22) Filed: Jun. 3, 2015

(65) Prior Publication Data

US 2016/0357884 A1 Dec. 8, 2016

(51) Int. Cl.
*G06F 17/50* (2006.01)

(52) U.S. Cl.
CPC ...... *G06F 17/5009* (2013.01); *G06F 17/5018* (2013.01)

(58) Field of Classification Search
CPC ............. G06F 17/5018; G06F 17/5009; G06F 2217/16
See application file for complete search history.

(56) References Cited

U.S. PATENT DOCUMENTS

| | | | |
|---|---|---|---|
| 7,535,425 B2 | 5/2009 | Vicharelli et al. | |
| 7,844,407 B1* | 11/2010 | Shaeffer | G01R 29/0892 324/457 |
| 2005/0071097 A1* | 3/2005 | Nachamkin | G06F 17/5018 702/65 |
| 2005/0198599 A1* | 9/2005 | Sercu | G06F 17/5036 716/136 |

OTHER PUBLICATIONS

Wikipedia, Antenna (Radio), Jan. 2010.*
Riley et al., "Design and Modeling of Finite and Low-Profile, Ultra-Wideband Phased-Array Antennas," IEEE International Symposium on Phased Array Systems and Technology, pp. 484-491, Oct. 12, 2010.

(Continued)

*Primary Examiner* — Kyle R Quigley
(74) *Attorney, Agent, or Firm* — Young Basile Hanlon & MacFarlane, P.C.

(57) ABSTRACT

Methods and systems are presented for evaluating performance of a finite or infinite antenna array including a finite number of antennas. Typically, a model is generated for the antenna array, the model including an arbitrarily large antenna array with an arbitrarily large number of model antennas. Each model antenna has features defined by features of antennas of the finite or infinite antenna array. A unit cell is determined for the arbitrarily large antenna, and impedance matrices $Z_{antenna}$ and $Z_{periodic}$ are computed, $Z_{periodic}$ representing interactions among the unit cell and the other model antennas. From these matrices, the performance of the finite or infinite antenna array is assessed.

24 Claims, 10 Drawing Sheets

(56) References Cited

OTHER PUBLICATIONS

Hamdi et al., "Floquet Modal Analysis to Modelize and Study 2-D Planar Almost Periodic Structures in Finite and Infinite Extent with Coupled Motifs," Progress in Electromagnetics Research B, vol. 62, 63-86, Feb. 13, 2015.
Extended European Search Report from related EP Application No. 16172419.0-1954 dated Oct. 5, 2016.
Capolino, et al., "Efficient Computation of the 3D Green's Function for the Helmholtz Operator for a Linear Array of Point Sources using the Ewald Method," Journal of Computational Physics, 223 (2007) 250-261 (www.sciencedirect.com).
Katarina Blagovic, "Numerical Modeling of Planar Periodic Structures in Electromagnetics," Ecole Polytechnique Federale De Lausanne, These No. 3688 (2006).
Su, et al., "Integral-Equation Analysis of Frequency Selective Surfaces Using EWald Transformation and Lattice Symmetry," Progress in Electromagnetics Research, vol. 121, 249-269, 2011.
Maldonado, "Efficient Analysis of 2D Antenna Arrays using the ASM-MBF Method," KTH Electrical Engineering, Department of Electromagnetic Theory, Masters' Degree Project, Stockholm, Sweden, Jun. 2011 (XR-EE-ETK 2011:006).
Kelley, et al., "Array Antenna Pattern Modeling Methods that Include Mutual Coupling Effects," IEEE Transactions on Antennas and Propagation, vol. 41, No. 12, 1625-1632, Dec. 1993.
Capolino, et al., "Physical Preconditioning for Modeling 2D Large Periodic Arrays," Department of Electrical and Comp. Eng., University of Houston, 512-515, 2002.
Ludick, "Efficient Numerical Analysis of Finite Antenna Arrays using Domain Decomposition Methods," Dissertation presented for the degree of Doctor of Engineering in the Faculty of Engineering at Stellenbosch University, Dec. 2014 (Stellenbosch University http://scholar.sun.ac.za).
Makarov, et al., "Scan Impedance for an Infinite Dipole Array: Hansen's Formulas Compared with Ansoft HFSS Simulations," IEEE Antennas and Propagation Magazine, vol. 49, No. 4, 143-156, Aug. 2007.
Polemi, et al., "MoM-Oriented Array Green's Function for the Analysis of Large Finite Arrays," IEEE, 978-1-4244-2042-1/08, 4 pages, 2008.
Jones, et al., "Comments on 'Scan Impedance for an Infinite Dipole Array: Hansen's Formulas Compared with Ansoft HFSS Simulations,'" IEEE Antennas and Propagation Magazine, vol. 50, No. 1, Feb. 2008.
Makarov, et al., "Scan Impedance for an Infinite Dipole Array: Accurate Theoretical Model Compared to Numerical Software, IEEE Antennas and Propagation Magazine," vol. 50, No. 6, Dec. 2008.
Wasylkiwskyi, et al., "Efficiency as a Measure of Size of a Phased-Array Antenna," IEEE Transactions on Antennas and Propagation, 879-884, Nov. 1973.
Holter, et al., "On the Size Requirement for Finite Phased-Array Models," IEEE Transactions on Antennas and Propagation, vol. 50, No. 6, Jun. 2002.
Suleyman Adanir, "Efficient Computation of the Green's Function for Multilayer Structures with Periodic Dielectric Gratings," A Thesis Submitted to the Graduate School of Natural and Applied Sciences of Middle East Technical University, Feb. 2011.

\* cited by examiner

METHOD AND SYSTEM FOR ASSESSING PERFORMANCE OF ARBITRARILY LARGE ARRAYS

BACKGROUND

The solution of computational electromagnetics (CEM) problems involving periodic structures is of much interest to commercial as well as defense industries. Efficient and accurate CEM simulation enables, for example, an antenna designer to visualize a targeted antenna on a computer, providing in many cases more information than can ever be measured in a laboratory or in situ.

A commonly used technique for the analysis of arbitrarily large periodic structures is the electric field integral equation (EFIE) solved by the method of moments (MoM). EFIE-MoM is particularly well-suited for the analysis of planar structures. The MoM approach applies orthogonal expansions to translate the EFIE statement into a system of circuit-like simultaneous linear equations. Orthogonal sets of basis functions are used to expand the unknown current distribution $I_z$ with invocation of boundary conditions, including the values of the electric field on the surface and in the feed gap, through the use of an inner product formulation. This system of equations is solved to yield the current's expansion coefficients. The original current distribution is then determined by introducing these coefficients back into the basis function expansion.

Solving for periodic structures such as infinite arrays using MoM, however, requires significant computational power. One approach makes use of periodic Green's functions (GFs) in two dimensions (i.e., an infinite double summation.) Ewald's transformations may be employed to accelerate computation of the GF, but this requires a high degree of complexity to implement.

SUMMARY

Methods and systems are presented for assessing performance of finite antenna arrays, while improving speed and accuracy of computational electromagnetics modeling environments. In certain implementations, methods for use in evaluating performance of a finite antenna array including a finite number of antennas are presented, wherein a model of the finite antenna array is generated that includes an arbitrarily large antenna array comprised of an arbitrarily large number of model antennas, each model antenna having features defined by features of antennas of the finite antenna array. One or more processors may then determine a unit cell of the arbitrarily large antenna array, where the unit cell may be one of the model antennas. Two impedance matrices, $Z_{antenna}$ and $Z_{periodic}$ may then be computed for the unit cell. The matrix $Z_{periodic}$ represents interactions among the unit cell and the other model antennas within the arbitrarily large antenna array. The performance for the finite antenna array may then be determined based on the matrices $Z_{antenna}$ and $Z_{periodic}$.

The methods of these implementations may compute the surface currents on the unit cell for a given excitation signal based on the matrices $Z_{antenna}$ and $Z_{periodic}$. The computation of $Z_{antenna}$ may involve applying a method of moment technique derived for an electric field integral equation (EFIE) for the model of the finite antenna array. Further, the method of moments technique may involve expanding an unknown surface current distribution $I_S$ on a surface of the unit cell with sets of basis functions (e.g., Rao-Wilton-Glisson, RWG, basis functions) through an inner product operation in order to approximate the surface current distribution as a combination of the basis functions and expressed as a set of linearly independent equations, substituting the sets of basis functions into the EFIE, wherein the EFIE comprises the product of a set of test functions and a known electric field integrated over the surface of the unit cell, and integrating the resultant equation in two dimensions with a Green's function kernel from the EFIE, optionally extracting a singularity of the Green's function, if present, thereby obtaining the impedance matrix $Z_{antenna}$.

The computation of impedance matrix $Z_{periodic}$ may also make use of a method of moments technique derived for an EFIE for the model of the finite array, and RWG basis functions. In this calculation, an unknown surface current distribution $I_S$ on a surface of the unit cell may be expanded with sets of basis functions through an inner product operation in order to approximate the surface current distribution as a combination of the basis functions and expressed as a set of linearly independent equations. The sets of basis functions may then be substituted into the EFIE, wherein the EFIE comprises the product of a set of test functions and a known electric field integrated over the surface of the unit cell. The resultant equation may be integrated in two dimensions using the periodic Green's function kernel from the EFIE, thereby obtaining the impedance matrix $Z_{periodic}$. The accuracy of the approximation may be determined by a user-specified number of terms in a finite double summation operation to calculate the periodic Green's function.

Implementations may permit varying a set of parameters prior to, during or after the computing and summing steps, permitting particular parameters to be iterated in an optimization process, or for observation of changes on the performance characteristics of the physical antenna array being analyzed.

The methods described herein are not limited to pure metal antennas. For example, the plurality of model antennas each may include a pure metal component and a dielectric component. In such cases, the computation of $Z_{antenna}$ and $Z_{periodic}$ utilizes distinct sets of basis functions associated with the pure metal component and the dielectric component, and results, for each of $Z_{antenna}$ and $Z_{periodic}$, in an impedance matrix associated with the pure metal component, and an impedance matrix associated with the dielectric component.

Methods and systems are also presented for assessing performance of infinite antenna arrays. In certain implementations, methods for use in evaluating performance of an infinite antenna array including an infinite number of antennas are presented, wherein a unit cell of the arbitrarily large antenna array is determined, where the unit cell may be one of the antennas. Two impedance matrices, $Z_{antenna}$ and $Z_{periodic}$ may then be computed for the unit cell. The matrix $Z_{periodic}$ represents interactions among the unit cell and the other antennas within the arbitrarily large antenna array. The performance of the infinite antenna array may then be determined based on the matrices $Z_{antenna}$ and $Z_{periodic}$. The methods of these implementations may compute the surface currents on the unit cell for a given excitation signal based on the matrices $Z_{antenna}$ and $Z_{periodic}$. The computation of $Z_{antenna}$ may involve applying a method of moment technique derived for an electric field integral equation (EFIE) for the model of the infinite antenna array. Further, the method of moments technique may involve expanding an unknown surface current distribution $I_S$ on a surface of the unit cell with sets of basis functions (e.g., Rao-Wilton-Glisson, RWG, basis functions) through an inner product operation in order to approximate the surface current distribution as a combination of the basis functions and expressed as a set of linearly independent equations, substituting the sets of basis functions into the EFIE, wherein the EFIE comprises the product of a set of test functions and a known electric field integrated over the surface of the unit cell, and integrating the resultant equation in two dimensions with a Green's function kernel from the EFIE, optionally extracting a singularity of the Green's function, if present, thereby obtaining the impedance matrix $Z_{antenna}$. These methods are similarly not limited to pure metal antenna models, and may accommodate dielectric materials.

The computation of impedance matrix Zperiodic may also make use of a method of moments technique derived for an EFIE for the model of the infinite array, and RWG basis functions. In this calculation, an unknown surface current distribution IS on a surface of the unit cell may be expanded with sets of basis functions through an inner product operation in order to approximate the surface current distribution as a combination of the basis functions and expressed as a set of linearly independent equations. The sets of basis functions may then be substituted into the EFIE, wherein the EFIE comprises the product of a set of test functions and a known electric field integrated over the surface of the unit cell. The resultant equation may be integrated in two dimensions using the periodic Green's function kernel from the EFIE, thereby obtaining the impedance matrix Zperiodic. The accuracy of the approximation may be determined by a user-specified number of terms in n infinite double summation operation to calculate the periodic Green's function.

Also presented in certain implementations are tangible, non-transitory computer-readable medium storing instructions. When the instructions when read by one or more processors, cause the processor to perform the steps of one or more of the methods recited above. Also presented in certain implementations are devices comprised of one or more processors. The one or more processors are configured to generate a model for a finite antenna array, wherein the model includes an arbitrarily large antenna array comprised of an arbitrarily large number of model antennas, each model antenna having features defined by features of antennas of the finite antenna array. Operation of the processors further determines a unit cell of the arbitrarily large antenna array, wherein the unit cell comprises one of the model antennas. The processor(s) may then compute the impedance matrices $Z_{antenna}$ and $Z_{periodic}$ for the unit cell, and determine the performance of the finite antenna array based on the computed matrices, and optionally the surface currents on the finite antenna array for a given excitation signal using the computed matrices. In certain implementations, the one or more processors operate to perform one or more of the methods recited above.

DETAILED DESCRIPTION

I. Overview

Figure 1:
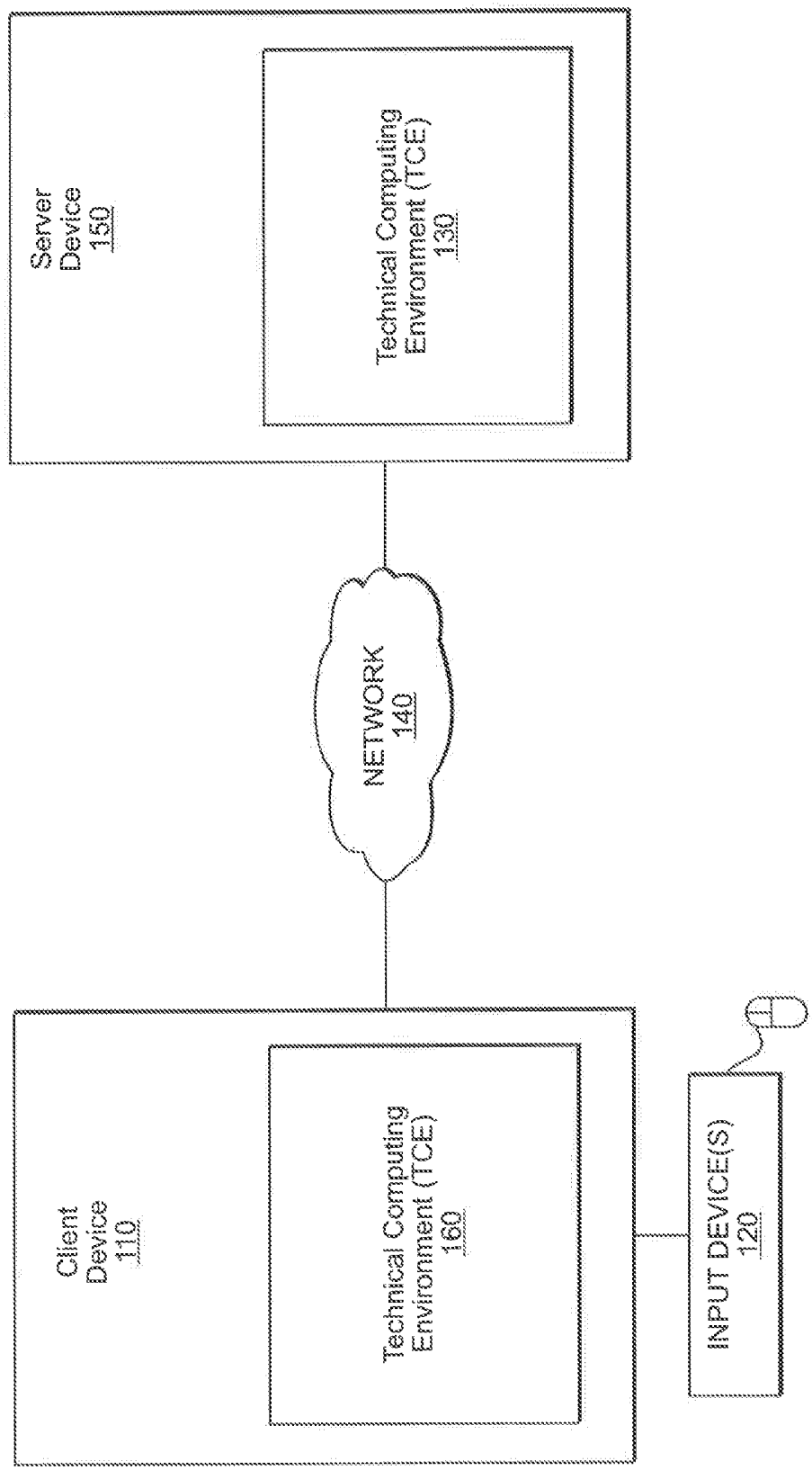
FIG. 1 is a block diagram showing an example of the systems of this disclosure.

Computer implemented systems and methods are presented for generating a simulation model of an arbitrarily large periodic structure, such as a frequency selective surface (FSS) or an arbitrarily large (infinite) antenna array. The systems and methods utilize an infinite array model of a physical, finite antenna array, to assist in estimating the performance thereof, in manner more computationally efficient and accurate than prior approaches. An example layout of an infinite array model is illustrated as surface S in FIG. 8. A user of such systems and methods is provided automatically, or on demand the arbitrarily large array model, comprised of an arbitrarily large number of model antennas 801, each having feature data associated with the antennas of the physical, finite antenna array. The infinite array model is employed to solve for the impedance (or interaction) matrix for the physical antenna array, through perturbation of the behavior of an isolated, impedance contributing unit cell 602 modeled as a single model antenna of the infinite antenna array model with the impedance contribution of other model antennas 801 in the infinite array model. From the impedance matrix, numerous performance characteristics of the physical antenna can be computed.

Methods and systems are presented for assessing performance of infinite and finite antenna arrays using virtual arbitrarily large (e.g., infinite) antenna array model, while improving speed and accuracy of computational electromagnetics modeling environments. Interaction matrices for modeled antenna arrays are obtained through use of method of moment analyses, wherein impedance matrices of unit cell antennas are computed with Green's function, and are perturbed with the mutual coupling effect of other elements in the arbitrarily large array using periodic Green's functions using fewer computational operations.

For the purpose of clarity, several embodiments described below are presented in the context of an infinite antenna array model, using triangular antenna surface element discretization. But those of skill in the art will recognize that the systems and methods described herein below are applicable to alternative discretization approaches (e.g., rectangular, hexagonal lattice, etc.). In addition, those of skilled in the art will recognize that the principles can also be applied to determining performance characteristics for finite arrays, and antenna structures that include dielectric materials.

In some implementations, the systems and methods are embodied in software stored and executable on one or more computing devices. A user can access the systems and methods using a user device, e.g., a computing device, remotely or locally. For example, the user device can interact with the systems and methods through a network, e.g., the Internet, and can display a user interface, e.g., a webpage, to the user. The user device can also host the systems and methods locally, e.g., by downloading and installing the software on the user device. The models can be constructed using the same systems and methods or different systems and methods that are hosted by the same computing device(s).

II. Examples of Systems

In the example shown in FIG. 1, a client device 110 accesses and interacts with a server device 150 through a network 140 to obtain information about infinite array models or choose an infinite array model for use. A user may interact with the client device 110 directly or through one or more input devices 120. The input device(s) 120 can be part of the client device 110 and can be a user device. In some implementations, the client device 110 can provide the desired information without needing to access the server device 150. In some implementations, historical data is provided to the server device 150 or to the client device 110 to generate the infinite array models. In some implementations, the server device 150 or the client device 110 does not generate infinite array models. Instead, infinite array models are provided to the server device 150.

The server device 150 hosts a technical computing environment (TCE) 130 in which the historical data is processed and the infinite array models are generated. In some implementations, the client device 110 may employ a TCE 160 to provide a display, e.g., a webpage. In some implementations, a user interacts with the server device 150 via the displayed webpage. The displayed TCE 160 operating on the client device 110 can be the same as or be part of the TCE 130 hosted by the server device 150. In some implementations, the TCE 160 is hosted on the client device 110. In such implementations, the client device 110 may not need to access the server device 150 to generate the desired model. Instead, infinite array models can be generated locally at the client device 110 in the TCE 160. The TCE 160 can provide an interface that allows a user to interact with the client device 110 and the server device 150.

The server device 150, the client device 110, and the network 140 can be connected through wired connections, wireless connections, or a combination of wired and wireless connections. Although one client device 110 and one server device 150 are shown, multiple client devices 110 can access one or more server devices 150 through the same network 140 or a different network. In some implementations, one or more server devices 150 host one or more TCEs 130, e.g., using virtual machines. Multiple server devices 150 can be used to execute program code, e.g., serially or in parallel, and may provide respective results of executing the program code to the client device 110.

The client device 110 can include one or more devices capable of receiving, generating, storing, processing, and/or providing program code and/or information associated with program code for a model. For example, the client device 110 includes a computing device, such as a desktop computer, a laptop computer, a tablet computer, a mobile phone (e.g., a smart phone, a radiotelephone, etc.), or a similar device. In some implementations, the client device 110 receives information from and/or transmits information to the server device 150.

The server device 150 may include one or more devices capable of receiving, generating, storing, processing, evaluating, and/or providing program code and/or information associated with program code for a model. Additionally, the server device 150 also includes one or more devices capable of comparing multiple models generated from the same set of historical data. For example, the server device 150 includes a computing device, such as a server, a desktop computer, a laptop computer, a tablet computer, or a similar device.

The network 140 can include one or more wired and/or wireless networks. For example, network 140 includes a cellular network, a public land mobile network (PLMN), a local area network (LAN), a wide area network (WAN), a metropolitan area network (MAN), a telephone network (e.g., the Public Switched Telephone Network (PSTN)), an ad hoc network, an intranet, the Internet, a fiber optic-based network, a private network, a cloud computing network, and/or a combination of these or other types of networks.

Figure 2:
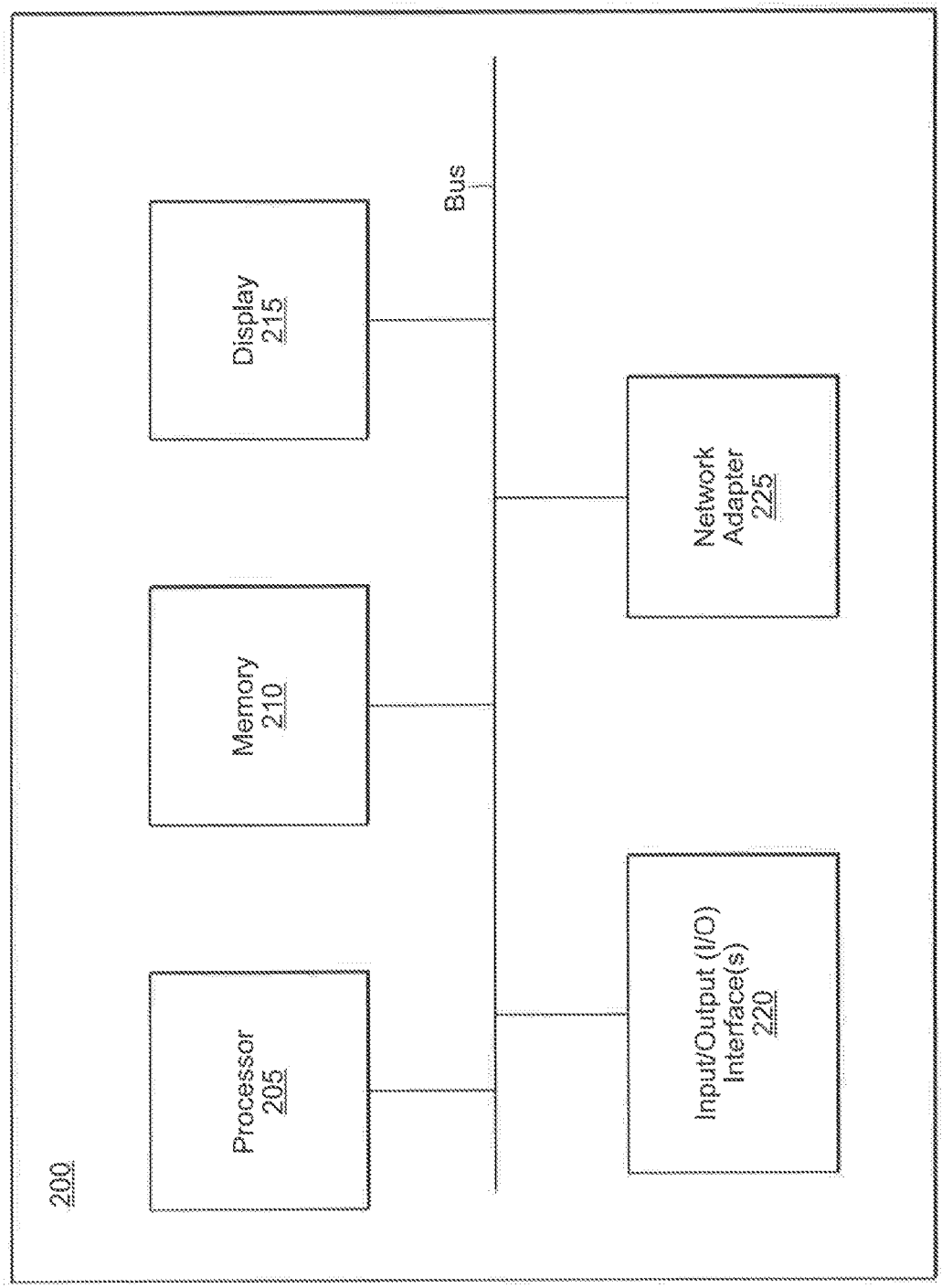
FIG. 2 is a block diagram showing an example of a computing system.

Referring also to FIG. 2, as an example, the client device 110 or the server device 150 can include a computing system 200 that includes one or more processors 205, memory 210, input/output (I/O) interface(s) 220, and a network adaptor 225. Optionally, the computing system 200 also includes a display 215. The one or more processors can be microprocessors, or other types of processing logic that may interpret, execute, and/or otherwise process information contained in, for example, the memory 210. The information may include computer-executable instructions and/or data that may implement one or more embodiments. The computing system 200 may include a variety of hardware. The hardware may include, for example, some combination of one or more processors, microprocessors, field programmable gate arrays (FPGAs), application specific instruction set processors (ASIPs), application specific integrated circuits (ASICs), complex programmable logic devices (CPLDs), graphics processing units (GPUs), reduced instruction set computing (RISC)-based processing devices (e.g., ARM processors), or other types of processing logic that may interpret, execute, manipulate, and/or otherwise process the information. The computing system may include a single core or multiple cores. Moreover, the computing system 200 may comprise a system-on-chip (SoC), system-in-package (SiP), etc.

The I/O interface(s) 220 can be any device that receives inputs and/or provides outputs. Examples of such a device include a keyboard, a mouse, an audio input device, a touch screen, and an infrared input interface. The I/O interface(s) 220 can also be an interface for receiving and sending data to a user device or to another system, e.g., through a network. For example, the I/O interface(s) 220 can be an internet interface, a wireless interface, a data reader, or a printer. The input interface receives data, such as commands, user specifications, and historical data and testing data. The output interface outputs information, such as constructed infinite array model(s), and results of model comparisons. Components shown individually in the figure can be combined if desired. For example, a touch screen can have the combined capabilities of the I/O interface 220 and the display 215.

The network adapter 225 can allow the system 200 to exchange information with external networks. Examples of the network adapter 225 include a network interface card (NIC), such as, for example, wireless wide area network (WWAN) adapter, a local area network (LAN) adapter, etc.

In some implementations, the client device 110 and the server device 150 are owned by different entities. For example, an end user owns the client device 110, and a third party owns the server device 150. The server device 150 can provide a computer simulation modeling and validation service to the client device 110. In some implementations, the server device 150 includes a device operating in a remote computing environment, e.g., a cloud computing environment. Front-end applications (e.g., a user interface) may be separated from back-end applications (e.g., program code execution). Additionally, or alternatively, the server device 150 can perform one, more, or all operations described elsewhere herein as being performed by the client device 110.

The TCE 130/160 may include hardware or a combination of hardware and software that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc. In one implementation, the TCE 130/160 may include a dynamically-typed programming language (e.g., the M language, a MATLAB® language, a MATLAB-compatible language, a MATLAB-like language, etc.) that can be used to express problems and/or solutions in mathematical notations.

For example, the TCE 130/160 may use an array as a basic element, where the array may not require dimensioning. These arrays may be used to support array-based programming where an operation may apply to an entire set of values included in the arrays. Array-based programming may allow array-based operations to be treated as high-level programming that may allow, for example, operations to be performed on entire aggregations of data without having to resort to explicit loops of individual non-array operations. In addition, TCE 130/160 may be adapted to perform matrix and/or vector formulations that can be used for data analysis, data visualization, application development, simulation, modeling, algorithm development, etc. These matrix and/or vector formulations may be used in many areas, such as statistics, image processing, signal processing, control design, life sciences modeling, discrete event analysis and/or design, state based analysis and/or design, etc.

The TCE 130/160 may further provide mathematical functions and/or graphical tools (e.g., for creating plots, surfaces, images, volumetric representations, etc.). In one implementation, the TCE 130/160 may provide these functions and/or tools using toolboxes (e.g., MATLAB Antenna Toolbox™ for designing, analyzing and visualizing antenna elements), toolboxes for signal processing, image processing, data plotting, parallel processing, etc. Alternatively, or additionally, the TCE 130/160 may provide these functions as block sets or in another way, such as via a library, etc.

The TCE 130/160 may be implemented as a text-based environment (e.g., MATLAB software; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; Modelica or Dymola from Dynasim; etc.); a graphically-based environment (e.g., Simulink® software, Stateflow® software, SimEvents® software, Simscape™ software, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent and Keysight; Vision Program Manager from PPT Vision; Khoros from Khoral Research; GEDAE by Gedae, Inc.; Scicos from (INRIA); Virtuoso from Cadence; Rational Rose from IBM; Rhapsody or Tau from Telelogic; Ptolemy from the University of California at Berkeley; aspects of a Unified Modeling Language (UML) or SysML environment; etc.); or another type of environment, such as a hybrid environment that includes one or more of the above-referenced text-based environments and one or more of the above-referenced graphically-based environments.

The TCE 130/160 may include a programming language (e.g., the MATLAB language) that may be used to express problems and/or solutions in mathematical notations. The programming language may be dynamically typed and/or array-based. In a dynamically typed array-based computing language, data may be contained in arrays and data types of the data may be determined (e.g., assigned) at program execution time.

For example, suppose a program, written in a dynamically typed array-based computing language, includes the following statements:

A='hello'
A=int32([1, 2])
A=[1.1, 2.2, 3.3]

Now, suppose the program is executed, for example, in a TCE, such as the TCE 130/160. During run-time, when the statement "A='hello'" is executed the data type of variable "A" may be a string data type. Later when the statement "A=int32([1, 2])" is executed the data type of variable "A" may be a 1-by-2 array containing elements whose data type are 32 bit integers. Later, when the statement "A=[1.1, 2.2, 3.3]" is executed, since the language is dynamically typed, the data type of variable "A" may be changed from the above 1-by-2 array to a 1-by-3 array containing elements whose data types are floating point. As can be seen by this example, data in a program written in a dynamically typed array-based computing language may be contained in an array. Moreover, the data type of the data may be determined during execution of the program. Thus, in a dynamically type array-based computing language, data may be represented by arrays and data types of data may be determined at run-time.

The TCE 130/160 may provide mathematical routines and a high-level programming language suitable for non-professional programmers and may provide graphical tools that may be used for creating plots, surfaces, images, volumetric representations, or other representations. The TCE 130/160 may provide these routines and/or tools using toolboxes (e.g., toolboxes for signal processing, image processing, data plotting, parallel processing, etc.). The TCE 130/160 may also provide these routines in other ways, such as, for example, via a library, local or remote database (e.g., a database operating in a computing cloud), remote procedure calls (RPCs), and/or an application programming interface (API). The TCE 130/160 may be configured to improve runtime performance when performing computing operations. For example, the TCE 130/160 may include a just-in-time (JIT) compiler.

Figure 3:
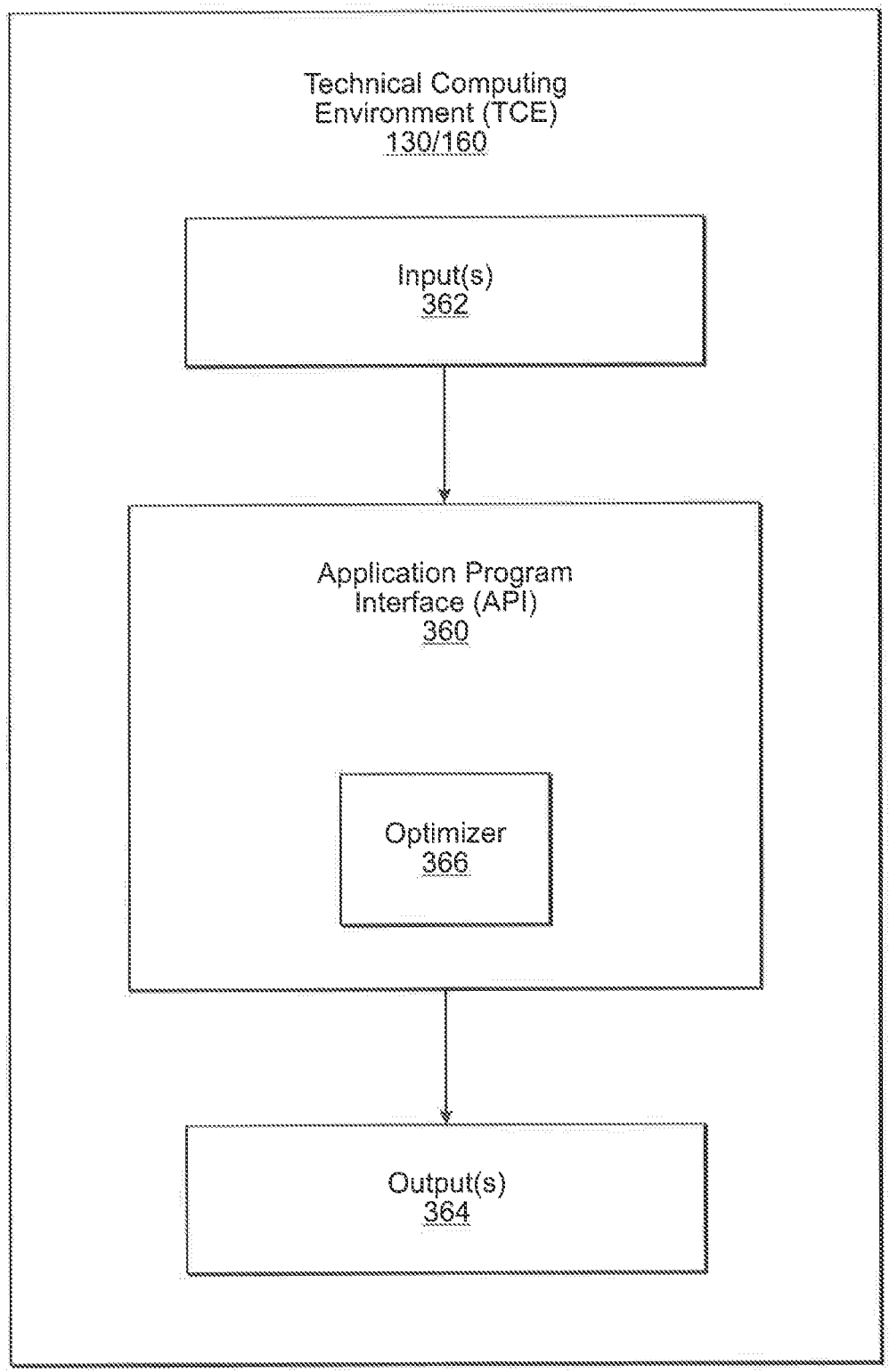
FIG. 3 is a block diagram showing an example of a technical computing environment.

Referring also to FIG. 3, the TCE 130/160 is supported by an application programming interface (API) 360. The API 360 can be visible to a user within the TCE 130/160, or can be invisible to the user. In some implementations, the API 360 specifies how portions of programming code implementing different parts of the methods of this disclosure, e.g., generating and/or comparing infinite array models, interact with each other to perform the methods and generate results. An example of a portion of programming code is an optimizer 366 that is capable of optimizing parameters. Other examples of the programming code portions can include, but not limited to, a model generator, equation solver, and graphical user interface (not shown). The API 360 can receive one or more inputs 362 from the TCE 130/160, or on behalf of a user or a user device, and output one or more outputs 364 to the TCE 130/160. Examples of inputs 362 include, for example, specifications for the infinite array models to be generated, ground plane information, testing data, etc. Examples of outputs 364 include generated models, results of model comparisons, and other user specified information.

Figure 4:
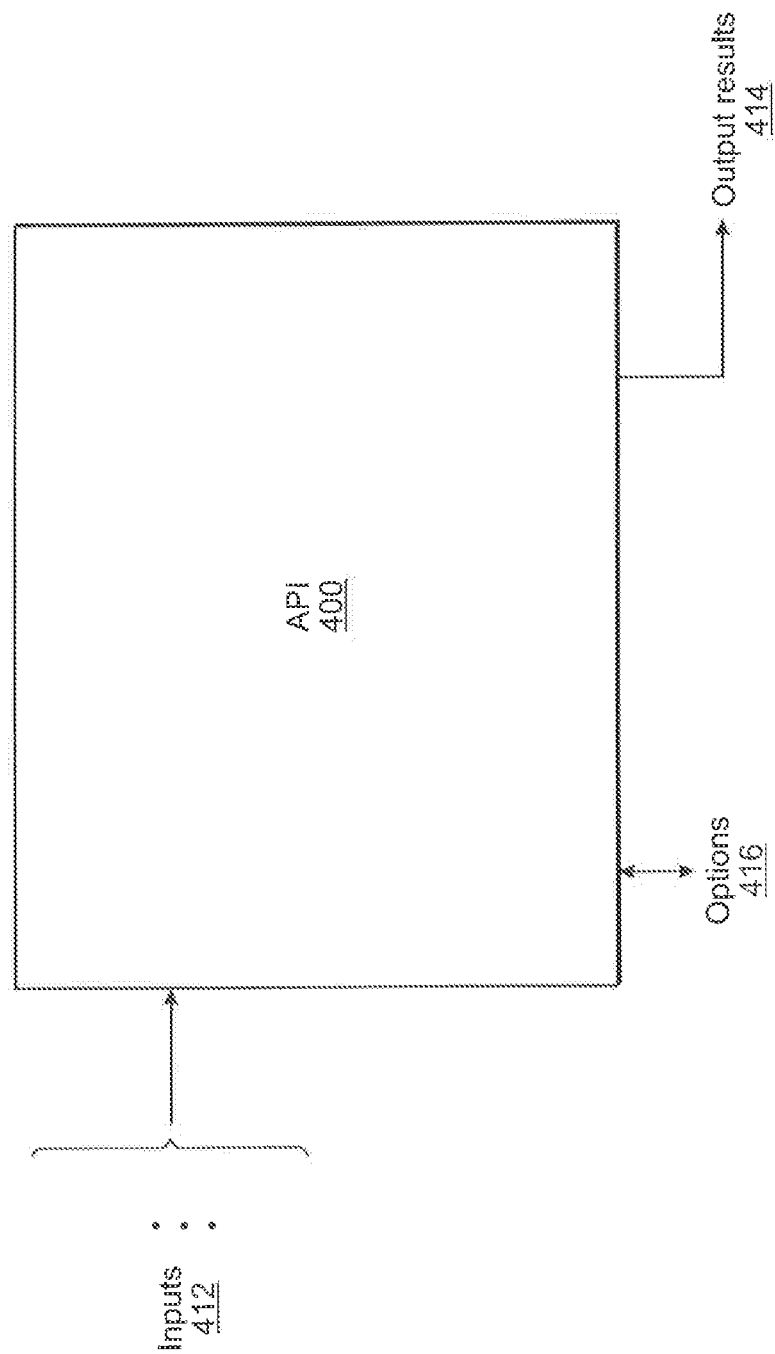
FIG. 4 is a block diagram of an example of an application programming interface.

Referring to FIG. 4, in some implementations, an API 400, which may be the same as the API 360 of FIG. 3, can be used to select or define an infinite array model. Inputs 412 provided to the API 400 can include information about the physical, finite antenna array whose performance is to be assessed, such as input frequencies and complex input voltage(s) to the physical antenna array, feed points, point(s) in space relative to the physical antenna array where electric and/or magnetic fields are to be determined, the physical antenna geometry which needs to be tiled, antenna materials, ground plane information, and/or other specifications. In some implementations, the API 400 also receives information about the manner in which the infinite array model may be generated. For example, the user may select an approach for discretizing the surface of the infinite array model to be generated, such as triangular, rectangular or hexagonal lattice. The input can be provided through text, commands, or program code in the API 400 or a TCE that interacts with the API.

Figure 6A:
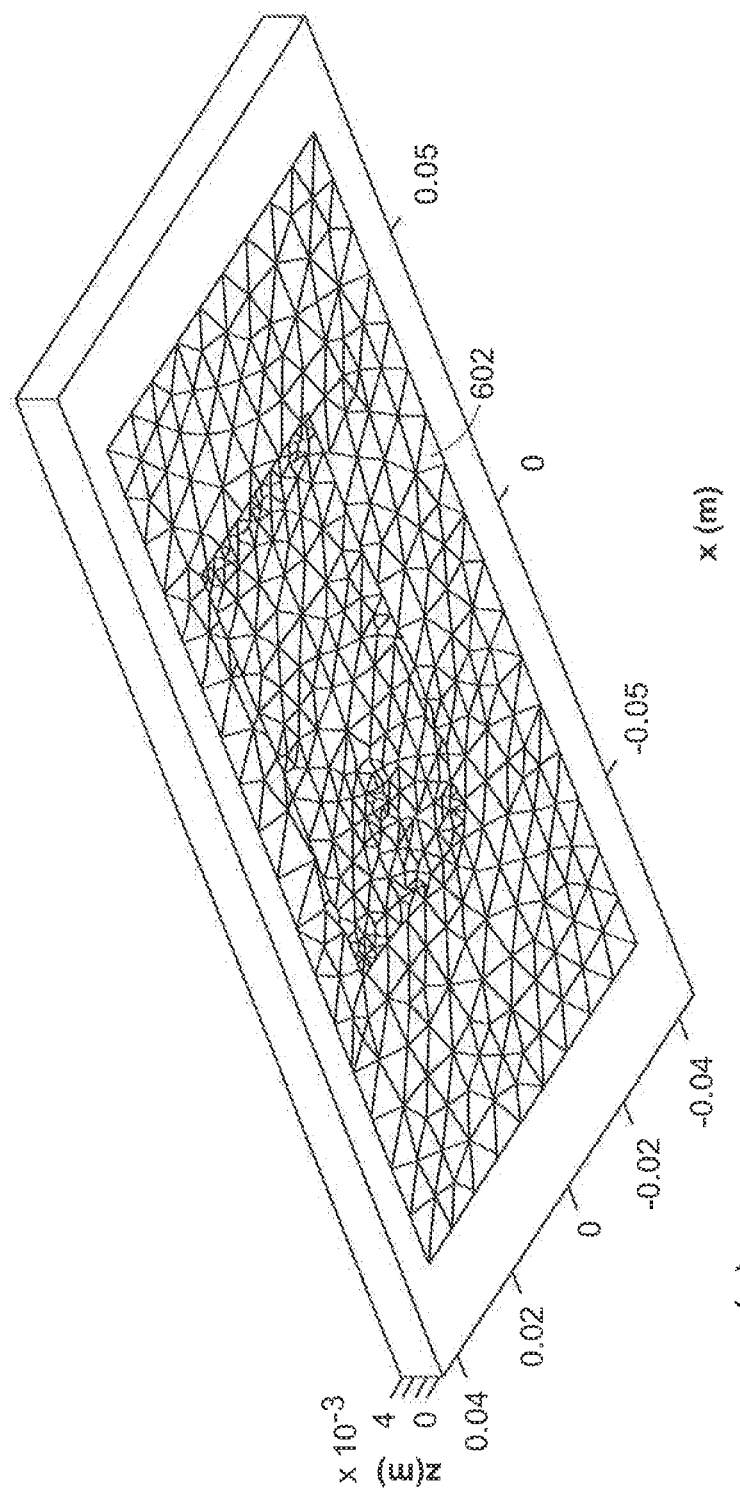
FIGS. 6A-6B are illustrations of portions of discretized meshes representing portions of a modeled antenna surface.
Figure 6B:
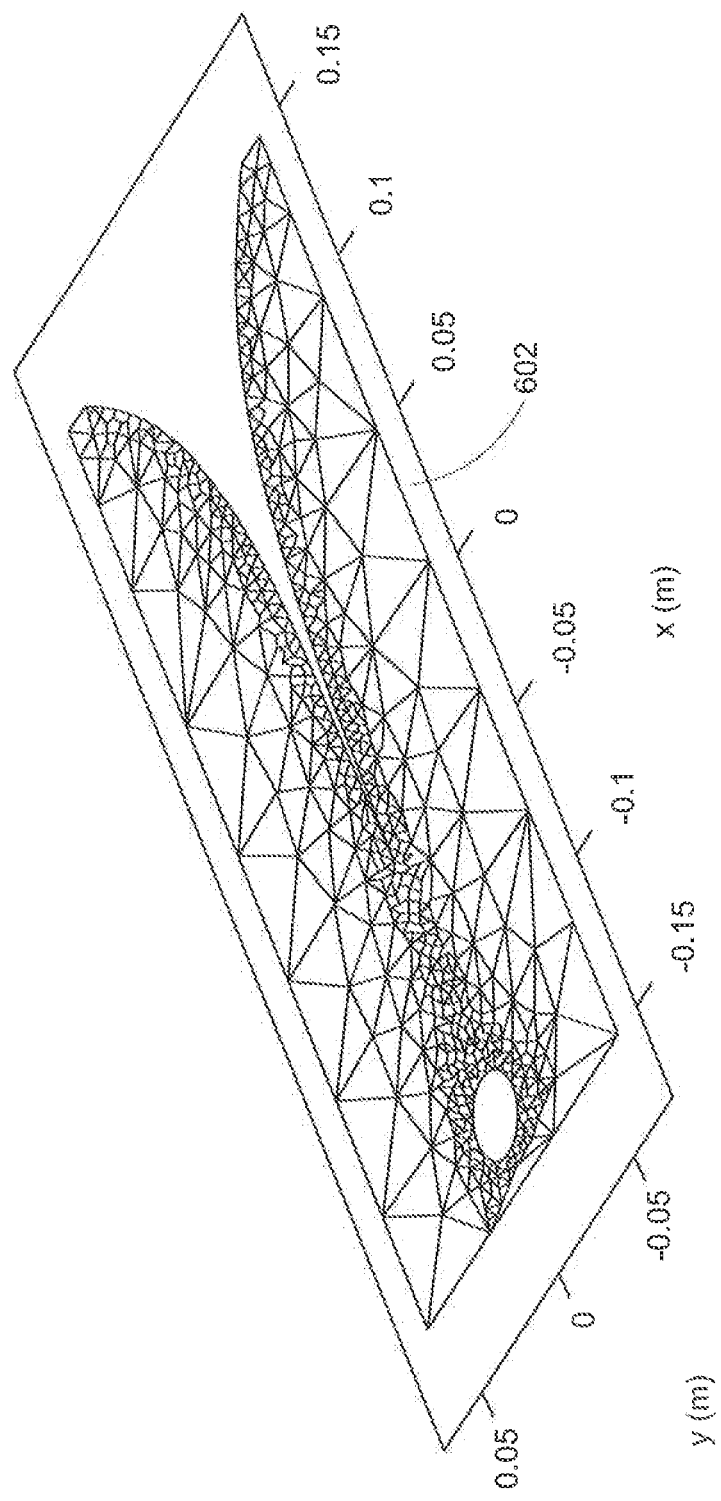
Figure 6C:
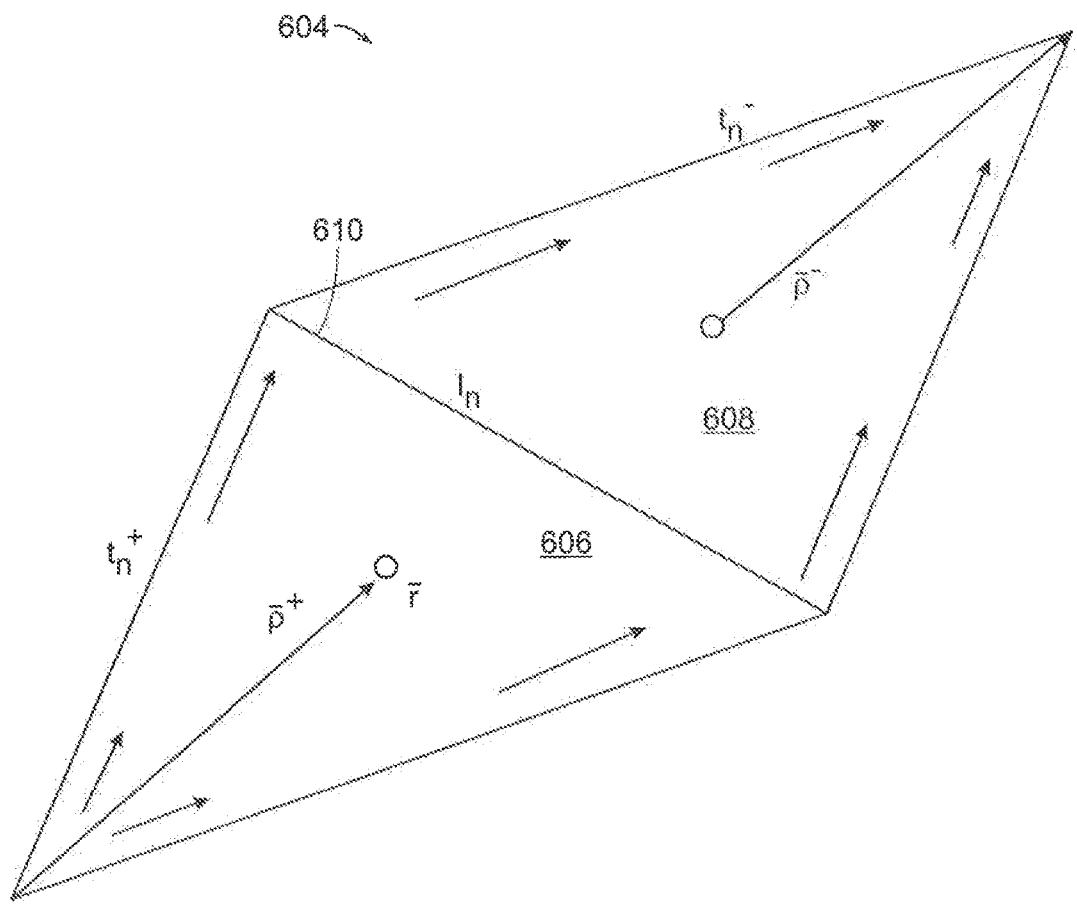
FIG. 6C is the depiction of the RWG basis functions used in the computation of $Z_{antenna}$ and $Z_{periodic}$.

In some implementations, the API 400 may be presented in the form of, or supporting, an interface (such as interface 220) through which a user or a machine may interact with the API 400, e.g., providing input to the API 400. For example, options 416 may be displayed on a graphical user interface, e.g., for the user to permit selection from among the displayed options. The choices can be made by activating the option, e.g., by pressing a button associated with a chosen option. The inputs 412 may also include historical data for generating infinite array models, and/or selections of the type of infinite array model to be generated. The available types of infinite array models and model antennas included therein can be displayed in the user graphical interface. For example, choices for model antennas 801 within the infinite array model may include a representative 2D planar antenna model such as shown in FIG. 6B, or a 3D patch antenna structure such as shown in FIG. 6C, or other model antenna structures.

Once the infinite array model is established, through inputs and/or default parameters, certain implementations may then determine the impedance matrix $\hat{Z}$ and associated performance characteristics of the modeled physical finite antenna array, and provide results 414 (which can be the same as outputs 364) to a user via API 400. The results 414 can include, for example, electric fields E, magnetic fields H, directivity, S-parameters, scan impedance, scan return loss, charge $\rho$ and current J distributions, at one or more points along the surface of the physical antenna array or at particular points in space in relation thereto. In some implementations, upon user request or automatically, the API 400 can output other information, for example, a subset of models that satisfy one or more specified criteria, to a user. In some implementations, the API 400 can output the results in a specified form (e.g., user or system specified) or in a default form, e.g., in the form of a graph or table.

In some implementations, the API 400 may cause at least some input parameters to be stored. Based on the stored information, systems of certain implementation may then perform multiple, iterative rounds of infinite array model generation, and results computation and evaluation, while varying selected parameters. For example, a user may wish to test different sets of physical antenna array specifications in order to achieve desired performance characteristics. In another example, the user may modify one or more physical antenna array input specification to learn about the effect on the results output.

The API 400 can be used for comparing infinite array models and associated results, and optionally other functions. Accordingly, the user or user device may interact with the API 400 in other manners, e.g., provide other inputs to and receive other outputs from the API 400, for the API 400 to perform other tasks.

The numbers and arrangements of devices and networks shown in FIGS. 1-4 are provided as examples. In practice, there can be additional devices and/or networks, fewer devices and/or networks, different devices and/or networks, or differently arranged devices and/or networks than those shown in the figures. Furthermore, two or more devices shown in the figures can be implemented within a single device, or a single device shown in the figures can be implemented as multiple, distributed devices.

III. Example Implementations of Arbitrarily Large Array Performance Estimation

The port impedance of an antenna, or an array of antennas, is fundamental to understanding its operation at RF frequencies. If the port impedance is not "close" to that of the feeding transmission line, then very little power will be transmitted by the antenna (when the antenna is used in the transmitting mode), or very little power will be received by the antenna (if used in the receive mode.) With respect to antenna arrays, current circulating on the surface of one antenna element generally induces a voltage across the feedpoint of other antenna elements in the array. Due to the proximity of antenna elements in an array, their respective electric and magnetic fields interact, and therefore the currents on each antenna element are not simply a function of the applied voltage, but also depend on the currents in the other elements. The elements' feedpoint currents and voltages can be related to each other using the concept of mutual impedance between every pair of antennas in the array. The port impedance values can be determined by calculating the interaction between every basis function within the antenna geometry. The matrix so generated is called the interaction matrix $\hat{Z}$.

Generally, the aim of the CEM systems and methods herein modeling a physical, finite antenna array as an infinite array model is to find the interaction (or impedance) matrix, $\hat{Z}$ in the equation $$\overline{V} = \hat{Z}\overline{I}, \tag{Eq. 1}$$

where $\overline{V}$ is the applied voltage vector (a known quantity), and $\overline{I}$ is the current vector (an unknown quantity) on the surface of a unit cell 602, one of the model antennas 801 within the infinite array model. Once the impedance matrix $\hat{Z}$ is computed using Maxwell equations, the above system of equations may be solved to determine the unknown current vector I. In some implementations, from the current vector $\overline{I}$ values, performance characteristics of the physical finite antenna array, such as electric and magnetic fields in space, S-parameters, and/or charge and current distributions along the surface of the physical antenna may be computed. The impedance matrix $\hat{Z}$ may be approximated as follows $$\hat{Z} = Z_{antenna} + Z_{periodic} \tag{Eq. 2}$$

The term $Z_{antenna}$ represents a solution, e.g., an accurate solution, for the interaction of the various basis functions in a discretized unit cell 602 modeled as a single antenna using Green's function (GF). In order to account for the mutual coupling effect among different unit cells (i.e., between each element of the large array) within the infinite array model, $Z_{periodic}$ is added. $Z_{periodic}$ can be derived by solving the unit cell with the periodic Green's Function (PGF), and can have many fewer required terms than previous infinite array solver approaches.

In other words, impedance characteristics (and thereafter performance characteristics) of a physical antenna array can be determined from an infinite array model of the physical antenna by perturbing the behavior of an isolated, impedance-contributing unit cell 602 of the infinite array model with the impedance contribution of the infinite array PGF. $Z_{antenna}$ may be calculated very accurately using singularity extraction, and a higher order numerical integration may be performed for neighboring model antenna 801 within the infinite array model. Thus, fewer terms and operations (e.g., double sum) are required for calculating the PGF. This results in a much faster calculation with greater (user selected) accuracy than previous approaches. For example, where conventional solvers typically would compute hundreds of double sums, present implementations may use 50 or fewer terms. Each mathematical operation of the modeling process below may be performed in a manner slightly different than as described. The choice of alternative modeling math operations, including test and basis functions, will largely depend on the antenna geometry, materials or other antenna array characteristics.

One particular alternative of note, an extension of the specific implementations described below, includes the use of dielectric materials in the infinite array model. The implementations described in complete detail below assume the modeled surfaces are comprised of pure metal. It is quite possible, however, that each of the model antennas 801 comprising the surface of the infinite array model may include both a metal component and a dielectric component. In such implementations, test and basis functions distinct from those used to model the pure metal components may be used to model the dielectric components and solve for the associated impedances. This will result, for each impedance term $Z_{antenna}$ and $Z_{periodic}$, two distinct impedance matrices, one each for the pure metal component and the dielectric component, that will require summation to obtain $Z_{antenna}$ and $Z_{periodic}$.

Figure 5:
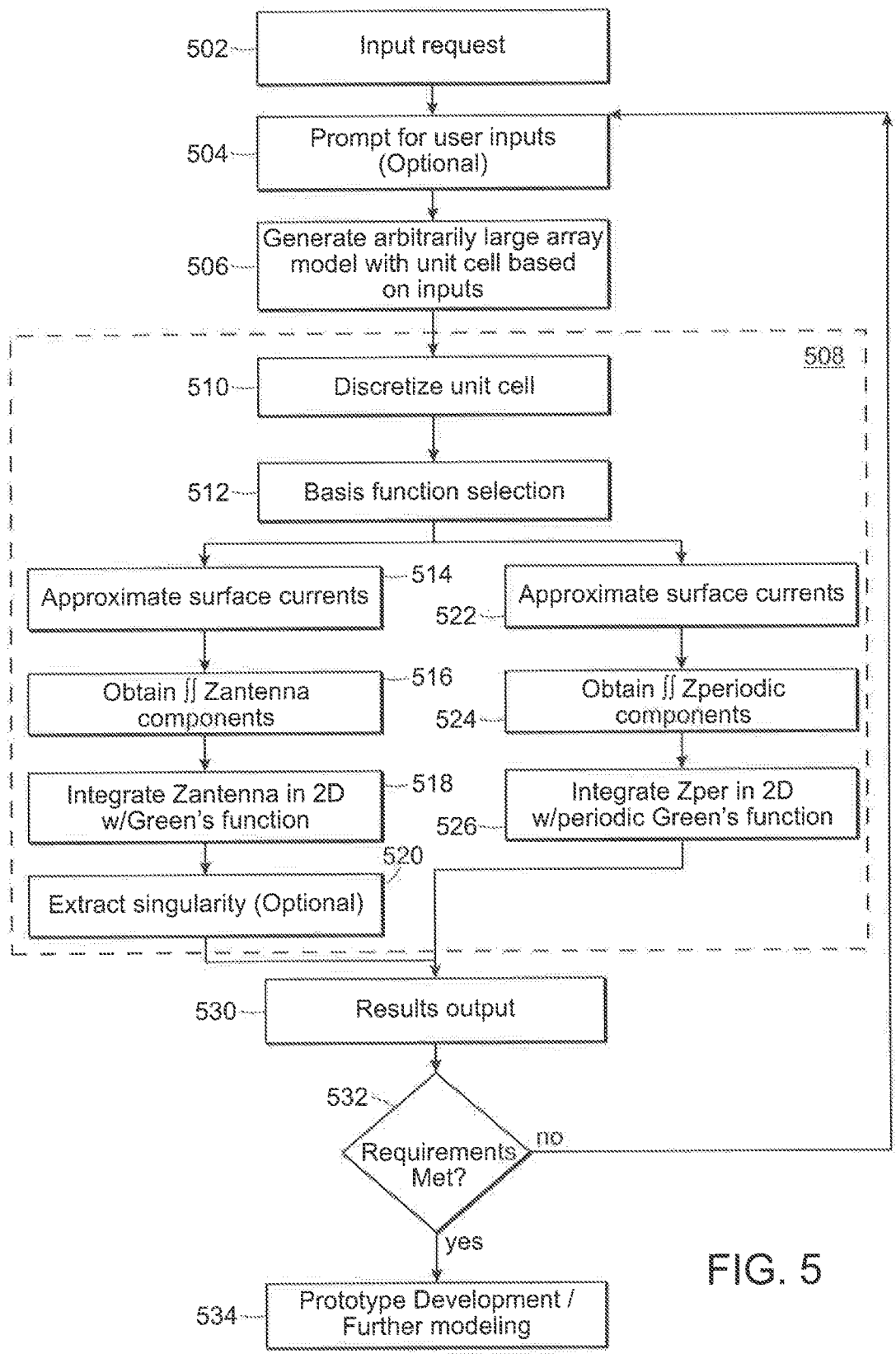
FIG. 5 is a flow diagram of an example process for estimating performance of an arbitrarily large array model for a physical antenna.

With reference to FIG. 5, the systems of this disclosure, including software stored on the server device 150, the client device 110, or the devices 150, 110, the TCEs 130, 160, and/or the APIs 360, 400 of FIGS. 1-4, can perform process 500 to generate infinite array models of the physical antenna array of interest, and solve for the associated impedances and other results. Although a particular sequence is described for the process 500, skilled artisans will appreciate that alternative mathematical approaches may be possible for particular steps. Further it may be possible to perform one or more steps in the process 500 at a different time relative to the other steps and/or in orders other than as shown in FIG. 5.

Initially, upon receipt (Step 502) of a request to estimate the performance of a physical antenna array, e.g., from a user or a user device, the systems may prompt (Step 504) the user or user device to input information about the infinite array model(s) to be generated. These inputs can be the same as inputs 362, 412 of FIGS. 3-4. For example, the systems may ask the user to provide input one or more of the following parameters: excitation signal frequency and voltage magnitude as well as the phase of the voltage, array geometry and materials design parameters, spatial points of interest for electric and magnetic fields determination, ground plane information, and desired outputs (364, 414) to be generated and/or or displayed. The systems may present, e.g., to the user, choices for options, such as options 416 of FIG. 4, for one or more of these inputs for selection. In some implementations, the systems receive all inputs 412, e.g., from the user or the user device, with the request for generating infinite array models without prompting the user to provide additional information. In some implementations, the systems interact with the user or the user device dynamically, e.g., in multiple steps, to prompt the user or the user device to provide the required or the missing inputs. The systems may not need to generate all or some of the infinite array models from input requirements. Instead, the systems may receive one or more partial infinite array models from an external input, e.g., from the user or the user device. When some inputs are not received, the systems may use one or more default parameters and inform the user that a default parameter has been used.

In step 506, an infinite array model is created. The infinite array model may have a layout shown as surface S in FIG. 8, which includes an arbitrarily large number of model antennas 801, each model antenna 801 having features defined by features of antennas of the finite antenna array of interest. Defined within the model is unit cell 602, a member of the model antennas 801. FIG. 6A and FIG. 6B illustrate, respectively, examples of possible three-dimensional and two-dimensional (planar) unit cells 602, each associated with two distinct infinite array models for two distinct physical antennas. Once the infinite array model, including its unit cell 602, are created, some implementations then begin the antenna model performance estimation process (Step 508.) Mathematical details of certain exemplary implementations of process 508 will be described in much greater detail in Sections IV and V below as including numerous sub-processes. In Step 510 the unit cell 602 is discretized into a mesh. The selection of discretization approach determines the basis functions to be selected (Step 512) for use in the numerical analysis. The adjacent triangle discretization of unit cells 602 shown in FIGS. 6A-6B leads to the use basis functions such as Rao-Wilton-Glis son (RWG) basis functions, illustrated as employing triangular surface elements 604 in FIG. 6C (see S. M. Rao, et al., "Electromagnetic scattering by surfaces of arbitrary shape," *IEEE Trans. Antennas and Propagation*, vol. AP-30, no. 3, pp. 409-418, May 1982, incorporated herein by reference.) However, the discretized mesh could alternatively comprise rectangles, or other repetitive structures, which would alter the mathematics of the non-limiting example solutions below.

Results, such as described above, of the antenna array performance estimation process 508 may be output in Step 530. A determination (Step 532) may then be made to determine whether the determined performance characteristics of the physical antenna array meet a user's requirements. Typical performance requirements specified for a physical antenna array include threshold values for scan impedance, scan return loss, as well as scan element pattern at specific angles from a bore sight. If the requirements are satisfied, the process may then proceed to other antenna modeling tasks, or progress to prototype development (Step 534). If the performance measures output do not meet the specified requirements, the process may iterate, e.g., from step 532, permitting the user to enter additional and/or different input parameters, or the system to automatically vary certain input parameters, until the output performance characteristics for the modeled physical antenna array satisfy the requirements.

Sections IV and V will now describe in detail exemplary solutions for the terms $Z_{antenna}$ and $Z_{periodic}$ of Eq. 2.

IV. Solving for $Z_{antenna}$

In some implementations, a MoM approach to a metal antenna is employed to solve for impedance matrix $Z_{antenna}$ Integral equations can be formulated for the currents flowing on the surface of the infinite array model. The MoM equation for a pure metal structure (an antenna or a scatterer) may be derived for the electric field integral equation (EFIE) (see A. F. Peterson, et al., *Computational Methods for Electromagnetics*, IEEE Press, Piscataway, N.J., 1998, incorporated herein by reference), utilizing the RWG basis functions. The EFIE advantageously can be used for both open and closed antenna structures.

IV.A Basis Functions for a Metal Structure

Figure 7:
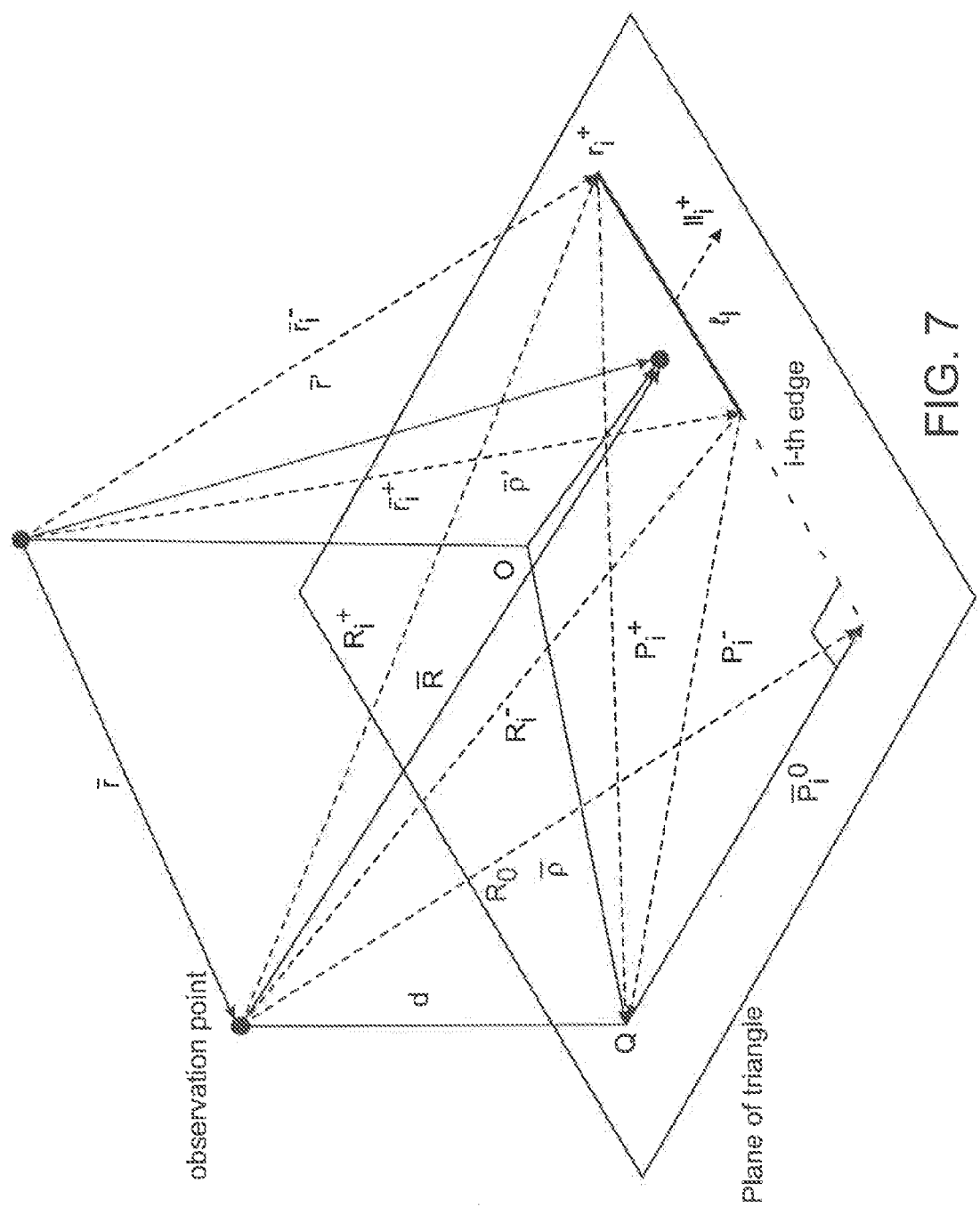
FIG. 7 is a geometric representation of the variables in the analytical formulas used in the calculation of $Z_{antenna}$.

With additional reference to FIGS. 6C and 7, a RWG basis function is defined (Step 512) to approximate discretized current distribution on an arbitrary electromagnetic scatterer or radiator, such as isolated surface element 604. In some embodiments, the RWG basis functions are defined on two adjacent (not necessarily co-planar) triangles, $t_n^+$ 606 and $t_n^-$ 608, sharing a common edge $l_n$ 610. This geometry resembles a small spatial dipole with linear current distribution where each triangle is associated with either positive or negative charge. For any two triangles, $t_n^+$ 606 and $t_n^-$ 608, having areas $A_n^+$ and $A_n^-$, and sharing a common edge $l_n$ 610, the basis function becomes $$\vec{f}_n^M(\vec{r}) = \begin{cases} \frac{l_n}{2A_n^+}\vec{\rho}_n^+ & \vec{r} \text{ in } t_n^+ \\ \frac{l_n}{2A_n^-}\vec{\rho}_n^- & \vec{r} \text{ in } t_n^- \end{cases} \quad (Eq. 3)$$

and $$\nabla \cdot \vec{f}_n^M(\vec{r}) = \begin{cases} \frac{l_n}{A_n^+} & \vec{r} \text{ in } t_n^+ \\ -\frac{l_n}{A_n^-} & \vec{r} \text{ in } t_n^- \end{cases} \quad (Eq. 4)$$

where $\vec{\rho}_n^+ = \vec{r} - \vec{r}_n^+$ is the vector drawn from the free vertex of triangle $t_n^+$ 606 to the observation point $\vec{r}$; and $\vec{\rho}_n^- = \vec{r}_n^- - \vec{r}$ is the vector drawn from the observation point to the free vertex of triangle $t_n^-$ 608. The basis function is zero outside the two adjacent triangles $t_n^+$ 606 and $t_n^-$ 608. The RWG vector basis function is linear and has no flux (that is, has no normal component) through its boundary.

In some implementations, the systems then calculate the interaction between the basis functions, using the free space Green's function ($e^{-jkr}/r$), as will now be described.

IV.B MoM Equations for a Metal Structure

IV.B.1 Scattering Problem

Figure 8:
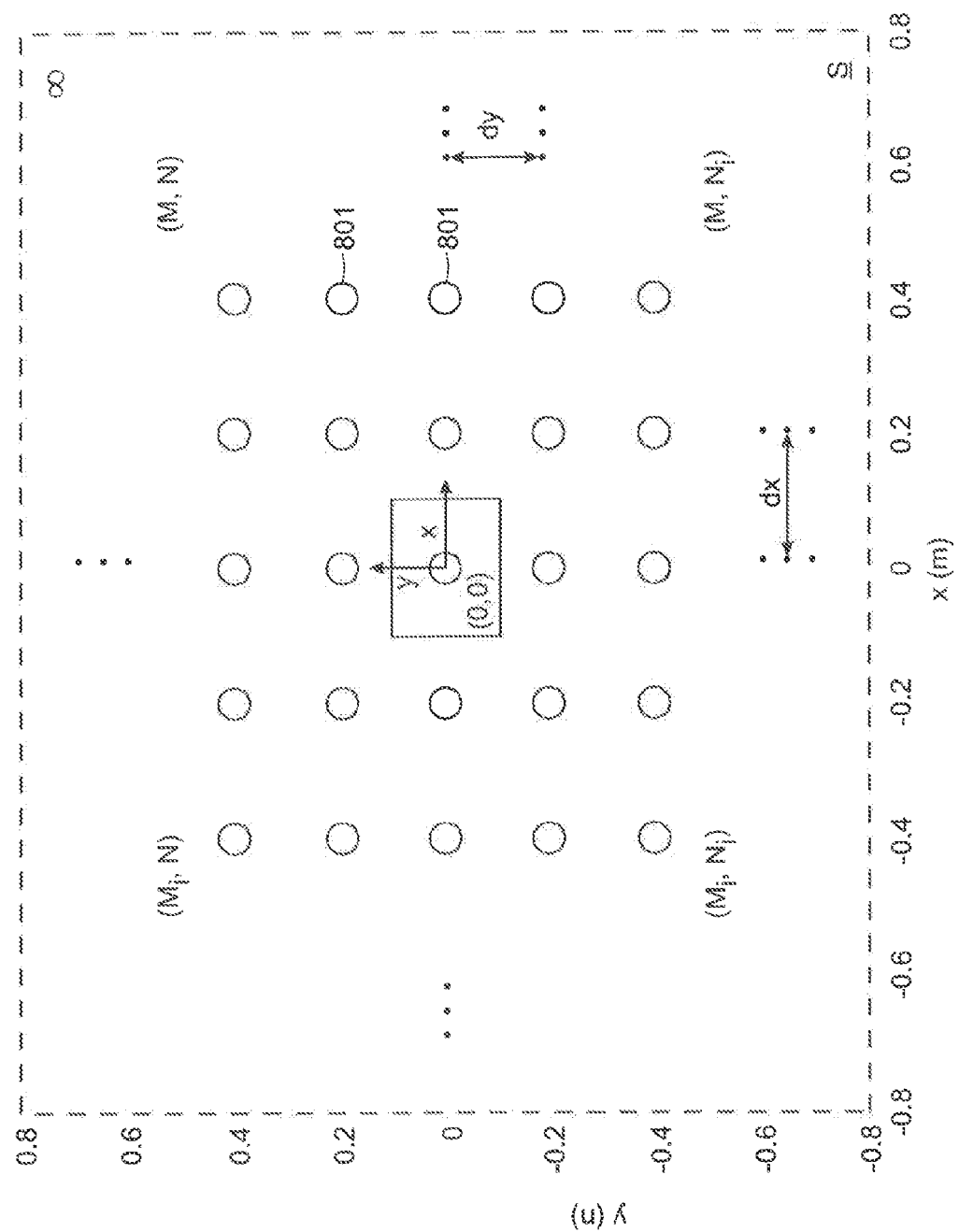
FIG. 8 is an illustration of an infinite array model layout.

Antenna scattering and radiation problems for a pure metal infinite array model, such as shown in FIG. 8, are essentially identical—the difference is that the "incident" field for a driven antenna is the applied electric field in the feed. Therefore, only the antenna scattering problem is considered herein. The total electric field is a combination of the incident electric field $\vec{E}^i$ and the scattered field $\vec{E}^s$, i.e.

$$\vec{E} = \vec{E}^i + \vec{E}^s \quad (Eq. 5)$$

The incident electric field $\vec{E}^i$ is either the incoming signal (scattering problem) or the excitation electric field in the antenna feed (radiation problem). The scattered electric field $\vec{E}^s$ is due to surface currents and free charges on the metal surface (the so-called "mixed-potential formulation", see A. F. Peterson supra)

$$\vec{E}^s = -j\omega \vec{A}_M(\vec{r}) - \nabla \Phi_M(\vec{r}) \quad \vec{r} \text{ on } S \quad (Eq. 6)$$

Herein the index M denotes the metal-surface S related quantities. The magnetic vector potential $\vec{A}_M(\vec{r})$ describes surface current radiation whereas the electric potential $\Phi_M(\vec{r})$ describes radiation of surface free charges. In the far field, both the $\Phi$-contribution and the $\vec{A}$-contribution are equally important. On the metal surface S, the tangential component of the total electric field vanishes, $\vec{E}_{tan}=0$, thus giving the electric field integral equations $$E_{tan}^i = (j\omega \vec{A}_M + \nabla \Phi_M)_{tan} \quad \vec{r} \text{ on } S \quad (Eq. 7)$$

IV.B.2 Test Functions

In some implementations, test functions are applied to generate (Step 514, in FIG. 5) a set of linearly independent equations that are used to formulate a MoM matrix equation populated with unknown expansion coefficients (as described in Section IV.B.4.) Assume that the test functions, $\vec{f}_m^M(\vec{r})$ m=1 ... $N_M$, cover the entire surface S and do not have a component normal to the surface. Multiplication of Eq. 7 by $\vec{f}_m^M$ and integration over S gives $N_M$ equations $$\int_S \vec{f}_m^M \cdot \vec{E}^i ds = j\omega \int_S \vec{f}_m^M \cdot \vec{A}_M ds - \int_S (\nabla \cdot \vec{f}_m^M) \Phi_M ds \quad (Eq. 8)$$

since, according to the Divergence theorem and using standard vector identities, $$\int_S \nabla \Phi_M \cdot \vec{f}_m^M ds = -\int_S \Phi_M (\nabla \cdot \vec{f}_m^M) ds \quad (Eq. 9)$$

if $\vec{f}_m^M$ does not have a component perpendicular to the surface boundary or edge (if any).

IV.B.3 Source Functions

The intention in some systems is to use the basis functions to obtain a suitable approximation for the current distribution on the surface S. The surface current density, $\vec{J}_M$ may be expanded into the basis functions (which usually coincide with the test functions) in the form $$\vec{J}_M(\vec{r}) = \sum_{n=1}^{N_M} I_n \vec{f}_n^M(\vec{r}) \quad (Eq. 10)$$

Where $I_n$ is an unknown complex expansion coefficient for the basis function. The magnetic vector potential has the form $$\vec{A}_M(\vec{r}) = \frac{\mu_0}{4\pi} \int_S \vec{J}_M(\vec{r}') g(\vec{r}, \vec{r}') ds' \quad (Eq. 11)$$

where $\mu_0$ is the permeability in vacuum and $g(\vec{r}, \vec{r}') = \exp(-jkR)/R$, $R = |\vec{r} - \vec{r}'|$ is the free-space Green's function (time dependency $\exp(j\omega t)$ is assumed everywhere). In the expression for the Green's function $\vec{r}$ is the observation (test) point and $\vec{r}'$ is the integration (source) point; both of them belong to the metal surface. After substitution of the expansion Eq. 10, the above equation becomes $$\vec{A}_M(\vec{r}) = \sum_{n=1}^{N_M} \left\{ \frac{\mu_0}{4\pi} \int_S \vec{f}_n^M(\vec{r}')g(\vec{r},\vec{r}')ds' \right\} I_n \quad \text{(Eq. 12)}$$

Similarly, the electric potential has the form $$\Phi_M(\vec{r}) = \frac{1}{4\pi\varepsilon_0} \int_S \sigma_M(\vec{r})g(\vec{r},\vec{r}')ds', \quad j\omega\sigma_M = -\nabla_S \cdot \vec{J}_M \quad \text{(Eq. 13)}$$

It follows from Eq. 13 that $\sigma_M$ can be expressed in terms of the current density, through the surface divergence using the continuity equation. Hence the electric scalar potential reduces to $$\Phi_M(\vec{r}) = \sum_{n=1}^{N_M} \left\{ \frac{1}{4\pi\varepsilon_0} \frac{j}{\omega} \int_S (\nabla \cdot \vec{f}_n^M(\vec{r}'))g(\vec{r},\vec{r}')ds' \right\} I_n \quad \text{(Eq. 14)}$$

IV.B.4 Moment Equations

In some implementations, moment equations are then formulated. The moment equations are obtained if expansions Eq. 12 and 14 are substituted into the integral Eq. 8. In terms of symbolic notations, $$\sum_{n=1}^{N_M} \hat{Z}_{mn}^{MM} I_n = v_m^M, \quad m = 1, \ldots, N_M \quad \text{(Eq. 15)}$$

$$v_m^M = \int_S \vec{f}_m^M \cdot \vec{E}^i ds \quad \text{(Eq. 16)}$$

comprise the "voltage" or excitation components for every test/basis function that have units V·m. The integral expressions are the components of the isolated surface element impedance matrix $\hat{Z}_{ant}^{MM}$ in an array of size ($N_M \times N_M$), $$Z_{mn}^{MM} = \left(\frac{j\omega\mu_0}{4\pi}\right) \int_S \int_S \vec{f}_m^M(\vec{r}) \cdot \vec{f}_n^M(\vec{r}')g(\vec{r},\vec{r}')ds'ds - \left(\frac{j}{4\pi\omega\varepsilon_0}\right) \int_S \int_S (\nabla \cdot \vec{f}_m^M)(\nabla \cdot \vec{f}_n^M)g(\vec{r},\vec{r}')ds'ds \quad \text{(Eq. 17)}$$

Note that the impedance matrix $\hat{Z}_{ant}^{MM}$ is symmetric for any set of basis functions (test functions should be the same) when the corresponding surface integrals are calculated precisely. The components of the impedance matrix are the double surface integrals of the Green's function and they mostly reflect the geometrical interaction between the "dipole" RWG basis functions of the problem. In matrix form, the N×N matrix Eq. 17 becomes $$\hat{Z}_{ant}^{MM} \vec{I} = \vec{v} \quad \text{(Eq. 18)}$$

Where $\hat{I}$ is a vector containing the unknown expansion coefficients associated with each of the RWG basis functions.

Substitution of Eqs. 3 and 4 into Eq. 17 (step 516) gives the components of the impedance matrix $\hat{Z}_{ant}^{MM}$ in terms of RWG basis functions in the form $$\int_S \int_S \vec{f}_m^M \cdot \vec{f}_n^M g(\vec{r},\vec{r}')ds'ds = \quad \text{(Eq. 19)}$$
$$+ \frac{l_m l_n}{4A_m^+ A_n^+} \int_{t_m^+} \int_{t_n^+} (\vec{\rho}_m^+ \cdot \vec{\rho}_n'^+)g(\vec{r},\vec{r}')ds'ds +$$
$$\frac{l_m l_n}{4A_m^+ A_n^-} \int_{t_m^+} \int_{t_n^-} (\vec{\rho}_m^+ \cdot \vec{\rho}_n'^-)g(\vec{r},\vec{r}')ds'ds +$$
$$\frac{l_m l_n}{4A_m^- A_n^+} \int_{t_m^-} \int_{t_n^+} (\vec{\rho}_m^- \cdot \vec{\rho}_n'^+)g(\vec{r},\vec{r}')ds'ds +$$
$$\frac{l_m l_n}{4A_m^- A_n^-} \int_{t_m^-} \int_{t_n^-} (\vec{\rho}_m^- \cdot \vec{\rho}_n'^-)g(\vec{r},\vec{r}')ds'ds$$

and $$\int_S \int_S (\nabla \cdot \vec{f}_m^M)(\nabla \cdot \vec{f}_n^M)g(\vec{r},\vec{r}')ds'ds = \quad \text{(Eq. 20)}$$
$$+ \frac{l_m l_n}{A_m^+ A_n^+} \int_{t_m^+} \int_{t_n^+} g(\vec{r},\vec{r}')ds'ds - \frac{l_m l_n}{A_m^+ A_n^-} \int_{t_m^+} \int_{t_n^-} g(\vec{r},\vec{r}')ds'ds -$$
$$\frac{l_m l_n}{A_m^- A_n^+} \int_{t_m^-} \int_{t_n^+} g(\vec{r},\vec{r}')ds'ds + \frac{l_m l_n}{A_m^- A_n^-} \int_{t_m^-} \int_{t_n^-} g(\vec{r},\vec{r}')ds'ds$$

IV.C Integral Calculation

IV.C.1 Base Integrals

About 90% of the computational time required for the filling of the MoM impedance matrix $\hat{Z}_{ant}^{MM}$ for the RWG basis functions is spent calculating the surface integrals (Step 518) presented in Eqs. 19 and 20. Consider a structure where all triangular patches are enumerated by p=1, ..., P. Then, every integral in Eq. 19 is built upon the term $$\vec{A}_{M\,pq}^{ij} = \int_{t_p} \int_{t_q} (\vec{\rho}_i \cdot \vec{\rho}_j')g(\vec{r},\vec{r}')ds'ds \quad \text{(Eq. 21)}$$

$$p, q = 1, \ldots, P \quad i, j = 1, 2, 3$$

Here, $\vec{\rho}_i = \vec{r} - \vec{r}_i$ for any vertex i of patch p whereas $\vec{\rho}'_j = \vec{r}' - \vec{r}_j$ for any vertex j of patch q. Similarly, every integral in Eq. 20 is built upon the term $$\Phi_{M\,pq} = \int_{t_p} \int_{t_q} g(\vec{r},\vec{r}')ds'ds \quad p, q = 1, \ldots, P \quad \text{(Eq. 22)}$$

The integrals of Eqs. 21 and 22 can be found in a number of ways.

IV.C.2 Singularity Extraction

The singularity of the free-space Green's function is integrable in two dimensions, but the accuracy of the Gaussian formulas is reduced if this singularity is retained. Therefore, singularity extraction may be used (optional Step 520) in Eqs. 21 and 22, in the form $$\int_{t_p} \int_{t_q} (\vec{\rho}_i \cdot \vec{\rho}_j')g(\vec{r},\vec{r}')ds'ds = \int_{t_p} \int_{t_q} \frac{(\vec{\rho}_i \cdot \vec{\rho}_j')}{|\vec{r}-\vec{r}'|} ds'ds + \quad \text{(Eq. 23)}$$
$$\int_{t_p} \int_{t_q} \frac{(\exp(-jk|\vec{r}-\vec{r}'|)-1)(\vec{\rho}_i \cdot \vec{\rho}_j')}{|\vec{r}-\vec{r}'|} ds'ds$$

$$\int_{t_p} \int_{t_q} g(\vec{r}, \vec{r}') ds' ds = \qquad \text{(Eq. 24)}$$

$$\int_{t_p} \int_{t_q} \frac{1}{|\vec{r}-\vec{r}'|} ds' ds + \int_{t_p} \int_{t_q} \frac{(\exp(-jk|\vec{r}-\vec{r}'|)-1)}{|\vec{r}-\vec{r}'|} ds' ds$$

The two first singular integral terms on the right-hand side of Eqs. 23 and 24 (i.e., the so-called potential or static integrals) may be found with the help of the analytical results given in D. R. Wilton, et al., "Potential integrals for uniform and linear source distribution on polygonal and polyhedral domains," *IEEE Trans. Antennas and Propagation*, vol. AP-32, no. 3, pp. 276-281, March 1984, the contents of which are hereby incorporated by reference in their entirety. The double self-integrals of Eqs. 23 and 24 may be evaluated analytically as in T. F. Eibert and V. Hansen, "On the calculation of potential integrals for linear source distributions on triangular domains," *IEEE Trans. Antennas and Propagation*, vol. AP-43, no. 12, pp. 1499-1502, December 1995, the contents of which are hereby incorporated by reference in their entirety.

IV.C.3 Analytical Calculation of Potential Integrals

Generally, the integration-by-parts approach of Wilton, et al. supra permits only the discovery of the inner potential integral presented in Eqs. 23 and 24. The outer integrals will still be found numerically, using their Gaussian cubatures (see R. Cools, "An Encyclopedia of Cubature Formulas," J. Complexity, vol. 19, 445-453, 2003, incorporated herein by reference.)

The view presented in FIG. 7, which comprises a geometric representation of one triangle edge of the discretized mesh element and an observation point, is useful in visualizing and describing many variables needed to find the potential integrals using the analytic formulas. Here, $\vec{\rho}$ is the projection vector of the observation point $\vec{r}$ onto the triangle plane, $\vec{\rho}'$ is the projection vector of the integration point $\vec{r}'$ onto the triangle plane, and R is the distance between the integration point and the observation point, i.e. $R=|\vec{r}'-\vec{r}|$. The analytic formula for the inner (potential) integral on the right-hand side of Eq. 24 has the following form:

$$\int_{t_q} \frac{1}{|\vec{r}-\vec{r}'|} ds' = -\alpha(\vec{\rho})|d| + \qquad \text{(Eq. 25)}$$

$$\sum_{i=1}^{3} \vec{P}_i^0 \cdot \vec{u}_i \left[ P_i^0 \ln \frac{R_i^+ + l_i^+}{R_i^- + l_i^-} + |d| \left( \tan^{-1} \frac{|d|l_i^+}{P_i^0 R_i^+} - \tan^{-1} \frac{|d|l_i^-}{P_i^0 R_i^-} \right) \right]$$

A summation may be made over the three edges of the triangle. Here, $\alpha(\vec{\rho})$ is the angle factor and is either 0 or $2\pi$ depending on whether the projection of the observation point is outside the triangle or inside the triangle, respectively. The quantity d is the height of the observation point above the plane of triangle t, measured positively in the direction of the triangle normal vector $\vec{n}$. The quantity d is calculated by $d = \vec{n} \cdot (\vec{r} - \vec{r}_i^+)$, where $\vec{r}_i^+$ is a given position vector to the "upper" endpoint of edge $l_i$, i=1, 2, 3. The upper endpoint is labeled with symbol "+". Triangle unit normal $\vec{n}$ is the cross product of side 1 and side 2 vectors of the triangle, where numbering the sides is arbitrary as long as it is consistent for each iteration of the formula. Alternatively, $\vec{r}_i^-$, a given position vector to the "lower" endpoint of edge $l_i$, i=1, 2, 3, can be used in the equation for d instead of $\vec{r}_i^+$.

The perpendicular vector from the endpoint of vector $\vec{\rho}$ in FIG. 2.1.2 to the edge $l_i$, i=1, 2, 3 or its extension may be given by $\vec{P}_i^0 = (\vec{\rho}_i^\pm - \vec{\rho}) - (l_i^\pm \vec{l}_i)/P_i^0$ where $\vec{\rho}_i^\pm$ are the vectors from point Q to the endpoints of the edge, which are equal to $\vec{r}_i^\pm - \vec{n}(\vec{n} \cdot \vec{r}_i^\pm)$. $\vec{l}_i$ is the edge vector and is equal to $\vec{r}_i^+ - \vec{r}_i^- / |\vec{r}_i^+ - \vec{r}_i^-|$. The endpoints of $\vec{l}_i$ are associated with distances $l_i^\pm = (\vec{\rho}_i^\pm - \vec{\rho}) \cdot \vec{l}_i$. The distance from the endpoint of vector $\vec{\rho}$ in to the edge $l_i$, i=1, 2, 3 or its extension is given by $P_i^0 = |(\vec{\rho}_i^\pm - \vec{\rho}) \cdot \vec{u}_i|$ (the proper sign must be taken into account). The vector $\vec{u}_i$ is the unit outer normal to the edge and is equal to $\vec{l}_i \times \vec{n}$. Distances measured from $\vec{\rho}$ to $\vec{\rho}_i^\pm$ are $P_i^\pm = |\vec{\rho}_i^\pm - \vec{\rho}| = \sqrt{(P_i^0)^2 + (l_i^\pm)^2}$. The two quantities $R_i^\pm = \sqrt{(P_i^\pm)^2 + d^2}$ are the distances measured from the observation point to the endpoints of the edge. The inner integral in Eq. 23 is similar to that in Eq. 24, except that it is multiplied by $\vec{\rho}'_j$. This results in a vector-valued integral. The corresponding analytic formula given in T. F. Eibert and V. Hansen, "On the calculation of potential integrals for linear source distributions on triangular domains," *IEEE Trans. Antennas and Propagation*, vol. AP-43, no. 12, pp. 1499-1502, December 1995 (incorporated herein by reference) provides the integral $$\int_{t_q} \frac{(\vec{r}' - \vec{r})_{\tan}}{|\vec{r} - \vec{r}'|} ds' = \frac{1}{2} \sum_{i=1}^{3} \vec{u}_i \left[ (R_i^0)^2 \ln \frac{R_i^+ + l_i^+}{R_i^- + l_i^-} + l_i^+ R_i^+ - l_i^- R_i^- \right] \qquad \text{(Eq. 26)}$$

where subscript tan denotes the vector projection onto the triangle plane, $R_i^0 = \sqrt{(P_i^0)^2 + d^2}$ is the distance measured from the observation point to the point intersected by $\vec{P}_i^0$ and $\vec{l}$. The remaining variables are the same as in Eq. 25. The inner integral on the right-hand-side of Eq. 23 is then obtained as a combination of Eqs. 25 and 26, i.e.

$$\int_{t} \frac{\rho'_j}{|\vec{r} - \vec{r}'|} ds' = \int_{t} \frac{(\vec{r}' - \vec{r})_{\tan}}{|\vec{r} - \vec{r}'|} ds' + (\vec{r} - \vec{r}_j)_{\tan} \int_{t} \frac{1}{|\vec{r} - \vec{r}'|} ds' \qquad \text{(Eq. 27)}$$

IV.D Fields

IV.D.1 Scattered Electric Field

Once the MoM solution is known, the scattered (or radiated) electric field may be found by Eq. 6

$$\vec{E}^s = \frac{-j\omega\mu_0}{4\pi} \sum_{n=1}^{N_M} \left\{ \int_S \vec{f}_n^M (\vec{r}') g(\vec{r}, \vec{r}') ds' \right\} I_n - \qquad \text{(Eq. 28)}$$

$$\frac{j}{4\pi\omega\varepsilon} \sum_{n=1}^{N_M} \left\{ \int_S \nabla \cdot \vec{f}_n^M (\vec{r}') \nabla_r g(\vec{r}, \vec{r}') ds' \right\} I_n$$

where $I_n$ is the MoM solution for surface current density.

IV.D.2 Scattered Magnetic Field

The scattered magnetic field created by a metal structure may be found by the curl of the magnetic vector potential, i.e.

$$\vec{H}^s = \frac{1}{4\pi} \int_S \sum_{n=1}^{N_M} \left\{ \left( -\vec{f}_n^M(\vec{r}\,') \times \nabla_r g(\vec{r}, \vec{r}\,') \right) ds' \right\} I_n \quad \text{(Eq. 29)}$$

IV.E Impedance Matrix $Z_{antenna}$ and the Radiated/Scattered Fields

A "neighboring" sphere of dimensionless radius R may be introduced for every integration facet. The radius R is a threshold value for the ratio of distance to size. The size of the facet $t_q$, $S(t_q)$, is measured as the distance from its center to the furthest vertex. The observation triangle $t_p$ lies within the sphere if the following inequality is valid for the distance d between two triangle centers $$\frac{d}{\sqrt{S(t_p)S(t_q)}} < R \quad \text{(Eq. 30)}$$

If a pair of triangles satisfies Eq. 30, then the integrals of Eqs. 21 and 22 use the singularity extraction of Eqs. 23, 24 and the analytical formulas of Eqs. 25-27 to determine the inner potential integrals. The non-singular component and the outer potential integrals employ Gaussian cubatures as described in R. Cools supra. Each cubature is characterized by two numbers: N, the number of integration points; and d, the degree of accuracy for the Gaussian cubature formula. If a pair of triangles does not satisfy Eq. 30, then the central-point approximation is used for all integrals, without singularity extraction.

V. Solving for $Z_{periodic}$

In order to solve for impedance matrix $\hat{Z}_{periodic}$ for a metal antenna structure, the MoM equation may again be derived for a surface element 604 of the infinite array model using the RWG basis functions. The derivation may begin in a manner somewhat similar to the derivation of $\hat{Z}_{antenna}$, except that the Green's function used in the derivation of $\hat{Z}_{antenna}$ is replaced by the periodic Green's function, in order to account for the impedance effect of the remainder of the model antennas in the infinite array model.

V.A Source Functions

The first portion of the analysis for $\hat{Z}_{periodic}$, approximating the surface currents (Step 522), may be performed in a manner nearly identical to that of solving for $\hat{Z}_{antenna}$ (Step 514), associated with the solutions of Eqs. 3-10. However, the magnetic vector potential has the new form $$\vec{A}_M(\vec{r}) = \frac{\mu_0}{4\pi} \int_S \vec{J}_M(\vec{r}) g_{per}(\vec{r}, \vec{r}\,') ds' \quad \text{(Eq. 31)}$$

where $\mu_0$ is the permeability in vacuum and $$g_{per}(\vec{r}, \vec{r}\,') = \sum_{m=-\infty}^{\infty} \sum_{n=-\infty}^{\infty} e^{j\phi_{mn}} \frac{e^{-jkR_{mn}}}{R_{mn}} \quad \text{(Eq. 32)}$$

where $R_{mn} = \sqrt{(x - x' - x_m)^2 + (y - y' - y_n)^2 + (z - z')^2}$ $\phi_{mn} = k(x_m \sin\theta\cos\varphi + y_n \sin\theta\sin\varphi)$ $x_m = m \cdot d_x, \quad y_n = n \cdot d_y$ is the periodic Green's function (time dependency exp(jωt) is assumed everywhere). In the above expression of the Green's function dx and dy are representative of the size of the unit cell while θ and φ are the scan angles. In the expression for the periodic Green's function, $\vec{r}$ is the observation (test) point and $\vec{r}\,'$ is the integration (source) point; both are in the plane of the metal surface. After substitution of the expansion, the above equation becomes $$\vec{A}_M(\vec{r}) = \sum_{n=1}^{N_M} \left\{ \frac{\mu_0}{4\pi} \int_S \vec{f}_n^M(\vec{r}\,') g_{per}(\vec{r}, \vec{r}\,') ds' \right\} I_n \quad \text{(Eq. 33)}$$

Similarly, the electric potential has the form $$\Phi_M(\vec{r}) = \frac{1}{4\pi\varepsilon_0} \int_S \sigma_M(\vec{r}) g_{per}(\vec{r}, \vec{r}\,') ds', \quad \text{(Eq. 34)}$$

$$j\omega\sigma_M = -\nabla_S \cdot \vec{J}_M$$

It follows from Eq. 34 that $\sigma_M$ can be expressed in terms of the current density, through the surface divergence using the continuity equation. Hence the electric scalar potential reduces to $$\Phi_M(\vec{r}) = \sum_{n=1}^{N_M} \left\{ \frac{1}{4\pi\varepsilon_0} \frac{j}{\omega} \int_S \left( \nabla \cdot \vec{f}_n^M(\vec{r}\,') \right) g_{per}(\vec{r}, \vec{r}\,') ds' \right\} I_n \quad \text{(Eq. 35)}$$

V.B Moment Equations

The moment equations may be obtained (Step 524), in a manner similar to that described above with respect to $\hat{Z}_{antenna}$, by substituting Eqs. 33 and 34 into the integral equation Eq. 8. In terms of symbolic notations, $$\sum_{n=1}^{N_M} \hat{Z}_{mn}^{per} I_n = v_m, \quad m = 1, \ldots, N_M \quad \text{(Eq. 36)}$$

$$v_m = \int_S \vec{f}_m^M \cdot \vec{E}^i ds \quad \text{(Eq. 37)}$$

comprise the "voltage" or excitation components for every test/basis function that have units V·m. The integral expressions comprise the components of the impedance matrix $\hat{Z}_{periodic}$ of size ($N_M \times N_M$), $$Z_{mn}^{per} = \left( \frac{j\omega\mu_0}{4\pi} \right) \int_S \int_S \vec{f}_m^M(\vec{r}) \cdot \vec{f}_n^M(\vec{r}\,') g_{per}(\vec{r}, \vec{r}\,') ds' ds - \quad \text{(Eq. 38)}$$

$$\left( \frac{j}{4\pi\omega\varepsilon_0} \right) \int_S \int_S \left( \nabla \cdot \vec{f}_m^M \right) \left( \nabla \cdot \vec{f}_n^M \right) g_{per}(\vec{r}, \vec{r}\,') ds' ds$$

In some implementations, unlike $\hat{Z}_{antenna}$, the impedance matrix $\hat{Z}_{periodic}$ is not symmetric and the entire matrix needs to be computed. The components of the impedance matrix comprise double surface integrals of the Green's function and they primarily reflect the geometrical interaction between the "dipole" RWG basis functions of the problem. In matrix form, Eq. (38) becomes $$\hat{Z}^{per}\vec{I}=\vec{v} \qquad \text{(Eq. 39)}$$

The components of this impedance matrix are similar to the ones derived in the expression for $\hat{Z}_{antenna}$. However, no singularity extraction needs to be performed in the calculation of the self-integrals. The integrals are calculated numerically (Step 526), significantly saving computation time while still achieving acceptable accuracy, by replacing the infinite sum with a finite number of terms in Eq. 32. The number of terms may be set by the systems to some default (e.g., m,n=10), or may be selected as an input to the process by the user (Step 504) as described above. A higher number of summation terms increases the accuracy of the solution, but also the computation time.

As used herein in relation to computing, the term component is intended to be broadly construed as hardware, firmware, and/or a combination of hardware and software.

Program code (sometimes referred to herein as code) is to be broadly interpreted to include text-based code that may not require further processing to execute (e.g., C or C++ code, Hardware Description Language (HDL) code, very-high-speed integrated circuits (VHSIC) HDL (VHDL) code, Verilog code, Java code, another type of hardware and/or software based code that may be compiled and/or synthesized, etc.), binary code that may be executed (e.g., executable files that may be directly executed by an operating system, bitstream files that may be used to configure an FPGA, Java byte code, object files combined together with linker directives, source code, makefiles, etc.), text files that may be executed in conjunction with other executables (e.g., Python text files, Octave files, MATLAB files, a collection of dynamic-link library (DLL) files with text-based combining, configuration information that connects pre-compiled modules, an extensible markup language (XML) file describing module linkage, etc.), graphical design models that may be executed in conjunction with other executables (e.g., LabView models, SystemVue models, Simulink models, Ptolemy models), source code (e.g., readable by a human), machine code (e.g., readable by a machine), or the like. In some implementations, program code may include different combinations of the above-identified classes of code (e.g., text-based code, graphical models, binary code, text files, source code, machine code, etc.). Additionally, or alternatively, program code may include code generated using a dynamically-typed programming language (e.g., the M language, a MATLAB® language, a MATLAB-compatible language, a MATLAB-like language, etc.) that may be used to express problems and/or solutions using mathematical notations. Additionally, or alternatively, program code may be of any type, such as a function, a script, an object, etc.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items, and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

Headings used herein are intended as aids for readability and should not be used to interpret or construe aspects of the technology or claims.

What is claimed is:

1. A method for use in evaluating performance of a finite antenna array including a finite number of antennas, comprising:

generating a model for the finite antenna array, the model including an arbitrarily large antenna array including an arbitrarily large number of model antennas, each model antenna having features defined by features of antennas of the finite antenna array;

determining, by one or more processors, a unit cell of the arbitrarily large antenna array, the unit cell comprising a model antenna;

computing, by the one or more processors, an impedance matrix $Z_{antenna}$ for the unit cell using a Green's function from an electric field integral equation (EFIE) for the model for the finite antenna array;

computing, by the one or more processors, an impedance matrix $Z_{periodic}$ for the unit cell using a periodic Green's function from the EFIE, the matrix $Z_{periodic}$ representing interactions among the unit cell and the other model antennas within the arbitrarily large antenna array; and determining performance of the finite antenna array based on the matrices $Z_{antenna}$ and $Z_{periodic}$,
where determining the performance of the finite antenna array based on the matrices $Z_{antenna}$ and $Z_{periodic}$ requires fewer computational operations than determining the performance of the finite antenna array based on the impedance matrix $Z_{periodic}$ without computing the impedance matrix $Z_{antenna}$.

2. The method of claim 1, further comprising computing surface currents on the unit cell for a given excitation signal based on the matrices $Z_{antenna}$ and $Z_{periodic}$.

3. The method of claim 1, wherein computing $Z_{antenna}$ comprises applying a method of moments technique derived for an electric field integral equation (EFIE) for the model of the finite antenna array.

4. The method of claim 3, wherein applying a method of moments technique further comprises:
expanding an unknown surface current distribution Is on a surface of the unit cell with sets of basis functions through an inner product operation in order to approximate a surface current distribution as a combination of the sets of basis functions and expressed as a set of linearly independent equations;
substituting the sets of basis functions into the EFIE, wherein the EFIE comprises a product of a set of test functions and a known electric field integrated over the surface of the unit cell; and
integrating a resultant equation in two dimensions with a Green's function kernel from the EFIE, optionally extracting a singularity of the Green's function, if present, thereby obtaining the impedance matrix $Z_{antenna}$.

5. The method of claim 4, wherein the sets of basis functions comprise Rao-Wilton-Glisson basis functions.

6. The method of claim 1, wherein computing impedance matrix $Z_{periodic}$ comprises applying a method of moments technique derived for an EFIE for the model of the finite antenna array.

7. The method of claim 6, wherein basis functions comprising Rao-Wilton-Glisson basis functions are substituted into the EFIE.

8. The method of claim 6, wherein applying a method of moments technique further comprises:
expanding an unknown surface current distribution Is on a surface of the unit cell with sets of basis functions through an inner product operation in order to approximate a surface current distribution as a combination of the sets of basis functions and expressed as a set of linearly independent equations;
substituting the sets of basis functions into the EFIE, wherein the EFIE comprises a product of a set of test functions and a known electric field integrated over the surface of the unit cell; and
integrating a resultant equation in two dimensions using the periodic Green's function kernel from the EFIE, thereby obtaining the impedance matrix $Z_{periodic}$.

9. The method of claim 8, wherein an accuracy of an approximation is determined by a user-specified number of terms in a finite double summation operation to calculate the periodic Green's function.

10. The method of claim 1, wherein:
the model antennas each include a pure metal component and a dielectric component; and
computing $Z_{antenna}$ and $Z_{periodic}$ utilizes distinct sets of basis functions associated with the pure metal component and the dielectric component, resulting in, for each of $Z_{antenna}$ and $Z_{periodic}$, an impedance matrix associated with the pure metal component, and an impedance matrix associated with the dielectric component.

11. A tangible, non-transitory computer-readable medium storing instructions, the instructions when read by one or more processors, cause the processor to:
generate a model for a finite antenna array, the model including an arbitrarily large antenna array including an arbitrarily large number of model antennas, each model antenna having features defined by features of antennas of the finite antenna array;
determine a unit cell of the arbitrarily large antenna array, the unit cell comprising a model antenna;
compute an impedance matrix $Z_{antenna}$ for the unit cell using a Green's function from an electric field integral equation (EFIE) for the model for the finite antenna array;
compute an impedance matrix $Z_{periodic}$ for the unit cell, using a periodic Green's function from the EFIE, to account for a remainder of the model antennas through use of periodic boundary conditions; and
determine performance of the finite antenna array based on the matrices $Z_{antenna}$ and $Z_{periodic}$,
where determining the performance of the finite antenna array based on the matrices $Z_{antenna}$ and $Z_{periodic}$ requires fewer computational operations than determining the performance of the finite antenna array based on the impedance matrix $Z_{periodic}$ without computing the impedance matrix $Z_{antenna}$.

12. The tangible, non-transitory computer-readable medium of claim 11, wherein the instructions further cause the one or more processors to determine surface currents on the finite antenna array for a given excitation signal utilizing the matrices $Z_{antenna}$ and $Z_{periodic}$.

13. The tangible, non-transitory computer-readable medium of claim 11, wherein the instructions further cause the one or more processors to:
expand an unknown surface current distribution Is on a surface of the unit cell with sets of basis functions through an inner product operation in order to approximate a surface current distribution as a combination of the sets of basis functions and expressed as a set of linearly independent equations;
substitute the sets of basis functions into the EFIE, wherein the EFIE comprises a product of a set of test functions and a known electric field integrated over the surface of the unit cell, thereby obtaining a set of double integral components of the impedance matrix $Z_{mn}$; and
integrate impedance matrix $Z_{mn}$ in two dimensions with a Green's function kernel from the EFIE, optionally extracting a singularity of the Green's function, if present, thereby obtaining the impedance matrix $Z_{antenna}$.

14. The tangible, non-transitory computer-readable medium of claim 11, wherein the instructions further cause the one or more processors to:
expand an unknown surface current distribution Is on a surface of the unit cell with sets of basis functions through an inner product operation in order to approximate a surface current distribution as a combination of the sets of basis functions and expressed as a set of linearly independent equations;
substitute the sets of basis functions into the EFIE, wherein the EFIE comprises a product of a set of test functions and a known electric field integrated over the surface of the unit cell, thereby obtaining a set of double integral components of an impedance matrix $Z_{mn}$; and approximate the impedance matrix $Z_{periodic}$ through double summation operations of components of the impedance matrix $Z_{mn}$ in two dimensions with a periodic Green's function kernel from the EFIE.

15. A device comprising one or more processors configured to:

generate a model for a finite antenna array, the model includes an arbitrarily large antenna array including an arbitrarily large number of model antennas, each model antenna having features defined by features of antennas of the finite antenna array;

determine, by one or more processors, a unit cell of the arbitrarily large antenna array, the unit cell comprising a model antenna;

compute, by the one or more processors, an impedance matrix $Z_{antenna}$ for the unit cell using a Green's function from an electric field integral equation (EFIE) for the model for the finite antenna array;

compute, by the one or more processors, an impedance matrix $Z_{periodic}$ for the unit cell using a periodic Green's function from the EFIE, the matrix $Z_{periodic}$ representing interactions among the unit cell and the other model antennas within the arbitrarily large antenna array; and determine performance of the finite antenna array based on the matrices $Z_{antenna}$ and $Z_{periodic}$, where determining the performance of the finite antenna array based on the matrices $Z_{antenna}$ and $Z_{periodic}$ requires fewer computational operations than determining the performance of the finite antenna array based on the impedance matrix $Z_{periodic}$ without computing the impedance matrix $Z_{antenna}$; and determine surface currents on the finite antenna array for a given excitation signal utilizing the matrices $Z_{antenna}$ and $Z_{periodic}$.

16. The device of claim 15, wherein the one or more processors are configured to compute impedance matrix $Z_{antenna}$ by:

expanding an unknown surface current distribution Is on a surface of the unit cell with sets of basis functions through an inner product operation in order to approximate a surface current distribution as a combination of the sets of basis functions and expressed as a set of linearly independent equations;

substituting the sets of basis functions into an electric field integral equation (EFIE) for an infinite array, wherein the EFIE comprises a product of a set of test functions and a known electric field integrated over the surface of the unit cell, thereby obtaining a set of double integral components of an impedance matrix $Z_{mn}$; and integrating the impedance matrix $Z_{mn}$ in two dimensions with a Green's function kernel from the EFIE, optionally extracting a singularity of the Green's function, if present, thereby obtaining the impedance matrix $Z_{antenna}$.

17. The device of claim 16, wherein the one or more processors are configured to compute impedance matrix $Z_{periodic}$ by:

expanding an unknown surface current distribution Is on a surface of the unit cell with sets of RWG basis functions through an inner product operation in order to approximate a surface current distribution as a combination of the sets of basis functions and expressed as a set of linearly independent equations;

substituting the sets of basis functions into the EFIE, wherein the EFIE comprises a product of a set of test functions and a known electric field integrated over the surface of the unit cell, thereby obtaining a set of double integral components of the impedance matrix $Z_{mn}$; and approximating impedance matrix $Z_{periodic}$ through double summation operations of components of impedance matrix $Z_{mn}$ in two dimensions with a periodic Green's function kernel from the EFIE.

18. The device of claim 15, wherein:

a plurality of surface elements each include a pure metal component and a dielectric component; and the one or more processors are configured to computer $Z_{antenna}$ and $Z_{periodic}$ utilizing distinct sets of basis functions associated with the pure metal component and the dielectric component, resulting in, for each of $Z_{antenna}$ and $Z_{periodic}$, an impedance matrix associated with the pure metal component, and an impedance matrix associated with the dielectric component.

19. A method for use in evaluating performance of a finite antenna array including a finite number of antennas using an infinite antenna array model, comprising:

determining a unit cell of the infinite antenna array model, the unit cell comprising an antenna;

computing, by one or more processors, an impedance matrix $Z_{antenna}$ for the unit cell using a Green's function from an electric field integral equation (EFIE) for the infinite antenna array model;

computing, by the one or more processors, an impedance matrix $Z_{periodic}$ for the unit cell using a periodic Green's function from the EFIE, the matrix $Z_{periodic}$ representing interactions among the unit cell and other antennas within the infinite antenna array model; and determining performance of the infinite antenna array model based on the matrices $Z_{antenna}$ and $Z_{periodic}$, where determining the performance of the infinite antenna array model based on the matrices $Z_{antenna}$ and $Z_{periodic}$ requires fewer computational operations than determining the performance of the infinite antenna array model based on the impedance matrix $Z_{periodic}$ without computing the impedance matrix $Z_{antenna}$.

20. The method of claim 19, further comprising computing surface currents on the unit cell for a given excitation signal based on the matrices $Z_{antenna}$ and $Z_{periodic}$.

21. The method of claim 19, wherein computing $Z_{antenna}$ comprises applying a method of moments technique derived for an electric field integral equation (EFIE) for the infinite antenna array model, through the steps of:

expanding an unknown surface current distribution Is on a surface of the unit cell with sets of basis functions through an inner product operation in order to approximate a surface current distribution as a combination of the basis functions and expressed as a set of linearly independent equations;

substituting the sets of basis functions into the EFIE, wherein the EFIE comprises a product of a set of test functions and a known electric field integrated over the surface of the unit cell; and integrating a resultant equation in two dimensions with a Green's function kernel from the EFIE, optionally extracting a singularity of the Green's function, if present, thereby obtaining the impedance matrix $Z_{antenna}$.

22. The method of claim 19, wherein computing impedance matrix $Z_{periodic}$ comprises applying a method of moments technique derived for an EFIE for the the infinite antenna array model.

23. The method of claim 22, wherein applying a method of moments technique further comprises:
- expanding an unknown surface current distribution Is on a surface of the unit cell with sets of basis functions through an inner product operation in order to approximate a surface current distribution as a combination of the basis functions and expressed as a set of linearly independent equations;
- substituting the sets of basis functions into the EFIE, wherein the EFIE comprises a product of a set of test functions and a known electric field integrated over the surface of the unit cell; and
- integrating a resultant equation in two dimensions using the periodic Green's function kernel from the EFIE, thereby obtaining the impedance matrix $Z_{periodic}$.

24. The method of claim 19, wherein:
- the infinite antenna array model comprises a plurality of model antennas each including a pure metal component and a dielectric component; and
- computing $Z_{antenna}$ and $Z_{periodic}$ utilizes distinct sets of basis functions associated with the pure metal component and the dielectric component, resulting in, for each of $Z_{antenna}$ and $Z_{periodic}$, an impedance matrix associated with the pure metal component, and an impedance matrix associated with the dielectric component.

* * * * *